United States Patent [19]
Matsushima et al.

[11] Patent Number: 5,428,503
[45] Date of Patent: Jun. 27, 1995

[54] JET COOLING APPARATUS FOR COOLING ELECTRONIC EQUIPMENT AND COMPUTER HAVING THE SAME MOUNTED THEREON

[75] Inventors: Hitoshi Matsushima, Ryugasaki; Toshihiro Komatu, Ibaraki; Yoshihiro Kondou, Hadano; Toshio Hatada, Tsuchiura; Susumu Iwai; Tetsuro Honma, both of Hadano; Toshiki Iino, Ibaraki; Takao Ohba; Akira Yamagiwa, both of Hadano, all of Japan

[73] Assignee: Hitachi, Ltd., Tokyo, Japan

[21] Appl. No.: 317,614

[22] Filed: Sep. 26, 1994

Related U.S. Application Data

[63] Continuation of Ser. No. 36,393, Mar. 24, 1993, abandoned.

[30] Foreign Application Priority Data

| Mar. 24, 1992 | [JP] | Japan | 4-065732 |
| Sep. 8, 1992 | [JP] | Japan | 4-239561 |

[51] Int. Cl.⁶ .................................. H05K 7/20
[52] U.S. Cl. .................................. 361/695; 165/908; 361/790
[58] Field of Search .............. 62/414, 418, 259.2; 165/80.3, 908; 257/707, 712, 713, 721–724; 174/16.1, 16.3; 361/689–695, 697, 721, 784, 796, 790

[56] References Cited

U.S. PATENT DOCUMENTS

| 3,626,251 | 1/1970 | Vigue | 174/16.1 |
| 4,093,021 | 6/1978 | Groom | 165/1 |
| 4,296,455 | 10/1981 | Lecycraft | 361/383 |
| 4,498,118 | 2/1985 | Bell . | |
| 4,748,540 | 5/1988 | Henneberg et al. . | |
| 4,750,087 | 6/1988 | Carpenter | 361/383 |
| 4,851,965 | 7/1989 | Gabuzda | 361/383 |
| 5,021,924 | 6/1991 | Kieda | 361/385 |
| 5,039,841 | 8/1992 | Kato | 219/388 |
| 5,196,989 | 3/1993 | Zsolnay | 361/383 |
| 5,361,188 | 11/1994 | Kondou et al. | 361/796 |

FOREIGN PATENT DOCUMENTS

| 1-28896 | 1/1989 | Japan . |
| WO89/02113 | 9/1989 | WIPO . |

Primary Examiner—Gerald P. Tolin
Attorney, Agent, or Firm—Antonelli, Terry, Stout & Kraus

[57] ABSTRACT

A cooling apparatus for electronic equipment for improving the reliability of the equipment by making uniform the temperature distribution of heat generating devices mounted on the electronic equipment, more particularly on a computer and for reducing the working process required at the time of performing a maintenance of a printed circuit board in the electronic equipment by stacking, in a frame, the electronic printed circuit boards on which the heat generating devices, such as a CPU and memories, are mounted at predetermined intervals. The cooling apparatus has a fan fastened to one wall surface of a chamber and a plurality of jet cooling devices formed on the surface opposing the wall surface. The jet cooling devices are formed in parallel to the printed circuit boards. The jet cooling devices are slits, or nozzles or jet stream ducts extending among the printed circuit boards and are so formed as to supply cooling air in a jet stream state to each heat generating device. Therefore, the cooling air can be concentrated to locally cool the printed circuit board including the device that generates heat of a large heating value. Hence, the temperature rise in the heat generating devices can be made uniform.

11 Claims, 41 Drawing Sheets

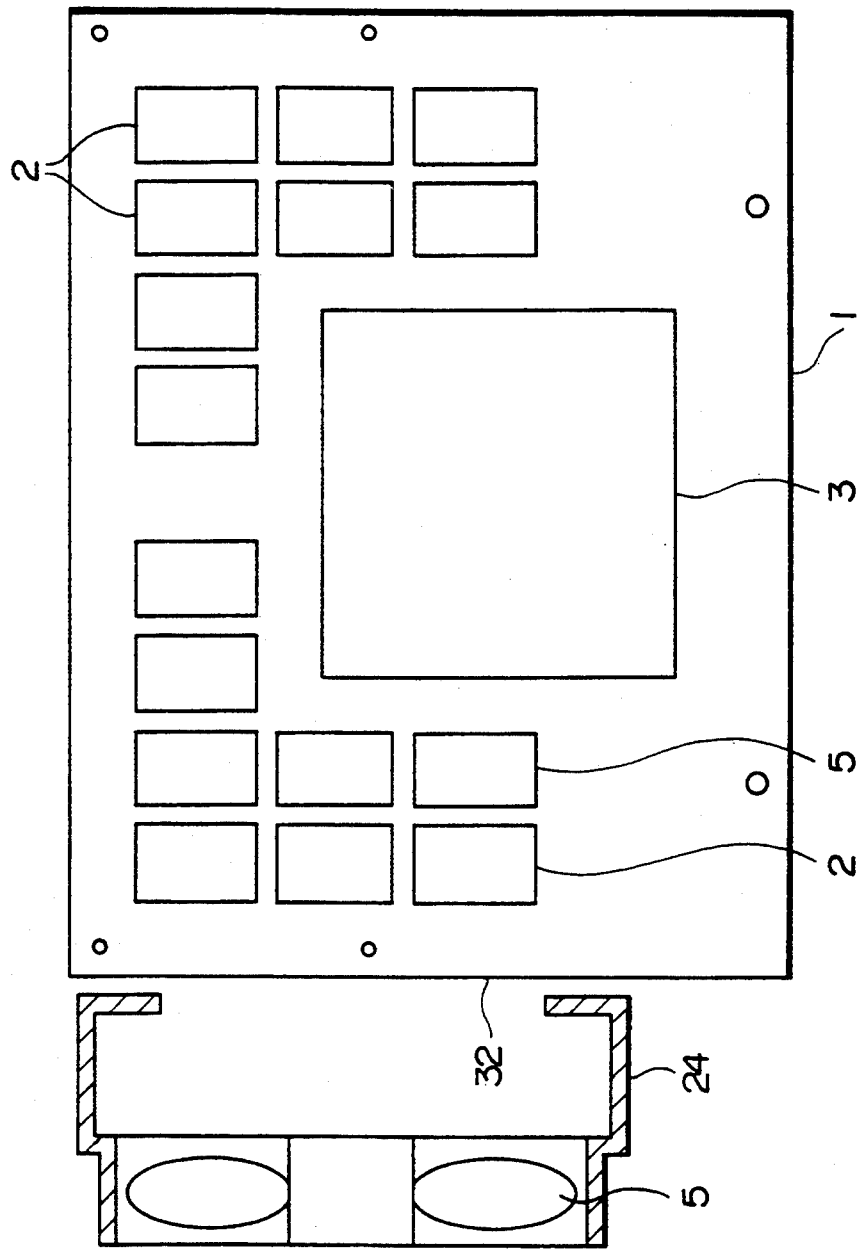

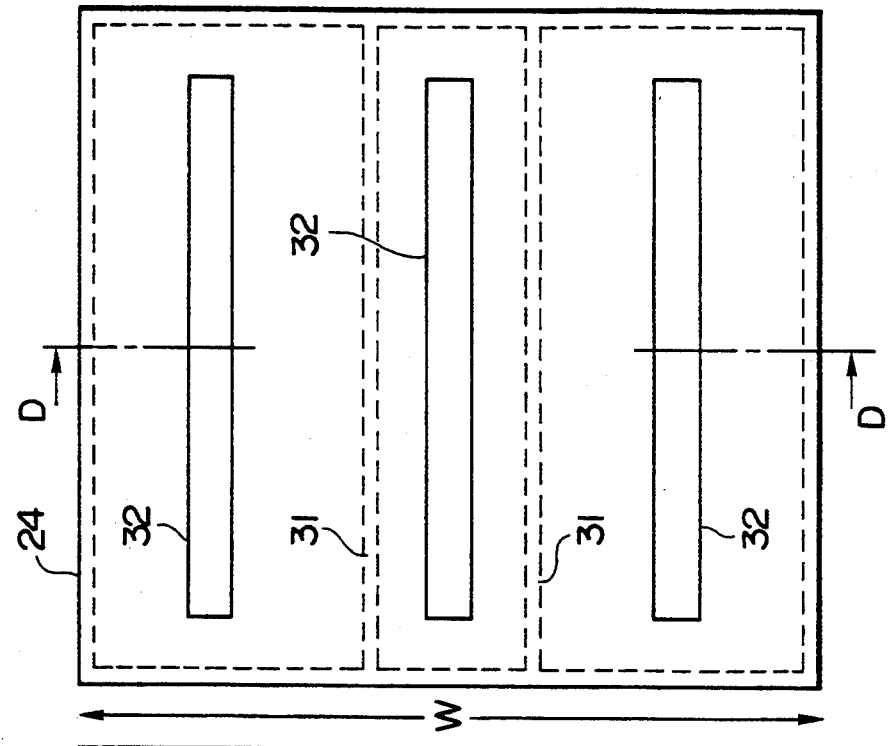
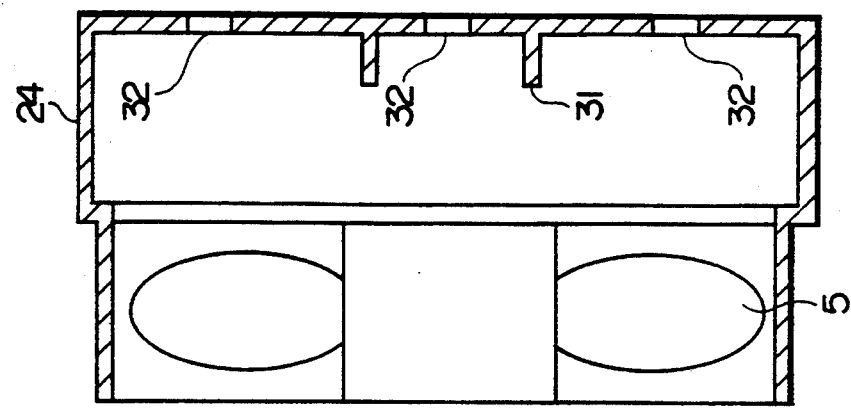

SECTION K-K

SECTION M-M

JET COOLING APPARATUS FOR COOLING ELECTRONIC EQUIPMENT AND COMPUTER HAVING THE SAME MOUNTED THEREON

This application is a continuation of Ser. No. 08/036,393, filed Mar. 24, 1993, now abandoned.

BACKGROUND OF THE INVENTION

The present invention relates to an electronic equipment cooling structure capable of satisfactorily cooling electronic printed circuit boards to be mounted in a frame of electronic equipment. More particularly, the present invention relates to an improved jet cooling apparatus for cooling electronic equipment that is satisfactorily adaptable to local cooling, and to a computer on which the jet cooling apparatus is mounted.

Hitherto, cooling of electronic equipment has been, as disclosed in, for example, Japanese Patent Laid-Open (i.e. Unexamined Publication) No. 61-85899, performed by using cooling fans disposed in a frame accommodating a multiplicity of electronic printed circuit bards, which are heat generating members, at longitudinal or vertical positions with respect to the electronic device groups to collectively cool all of the electronic printed circuit boards accommodated in the frame by the fans.

As is known in, for example, Japanese Patent Laid-Open No. 64-28896, if devices, the heating values of which are different, are mixed, use of individual concentrated air cooling means, separately from common air cooling means having the foregoing cooling fan, has been also considered.

An example of this has been disclosed in U.S. Pat. No. 4,851,965 (Jul. 25, 1989). In this case, a duct so disposed in parallel to the printed circuit boards as to cool IC chip groups mounted on printed circuit boards to be cooled has circular apertures. Furthermore, the diameters of the apertures are varied depending upon the heating values of the chips. As disclosed in Japanese Patent Laid-Open No. 1-115198, a duct, the cross sectional area of which is reduced downstream in the direction of the flow, is disposed above the top surfaces of the heat generating printed circuit boards, cooling air jetting ports are formed in the portions of the duct that correspond to the heat generating devices, and the jetting ports are closed by thermally deformable films.

However, the above-mentioned conventional cooling apparatus, in particular, the apparatus adapted to the total and collective cooling system disclosed in Japanese Patent Laid-Open No. 61-85899 encounters a problem in that a portion of the cooling air is not effectively used and accordingly the cooling efficiency is unsatisfactory. If a device which generates heat of a large heating value is locally present, the foregoing example must increase the overall air quantity to be supplied to the frame. In this case, the cooling air must be supplied by an extraordinary large quantity, causing a problem to take place in that noise of the cooling fan and/or the duct cannot be ignored.

The example disclosed in Japanese Patent Laid-Open No. 64-28896 suffers from a disadvantage that the duct and the air passage which constitute the concentrated air cooling means become too large and complicated. Therefore, the disclosed example is not suitable to simultaneously and concentratedly cool a plurality of the electronic printed circuit boards.

The example disclosed in U.S. Pat. No. 4,851,965 has a problem that the cost cannot be reduced because the small apertures are formed by the number of the chips. Another problem arises in that the small aperture can be clogged with dust or the like contained in the cooling air. Moreover, another problem of the pressure loss takes place because a throttle is provided in the passage for the cooling air.

In the case of Japanese Patent Laid-Open No. 1-115198, if the thermally deformable films are once melted by the heat of the heat generating devices, the jetting ports are brought to a state as if they were opened at the initial moment. Therefore, the structure becomes too complicated, and no means has been employed to prevent the pressure loss of the cooling air.

SUMMARY OF THE INVENTION

An object of the present invention is to provide a cooling apparatus for cooling electronic equipment exhibiting an excellent cooling efficiency thanks to a simple structure necessitating a small space and capable of concentratedly cooling a plurality of electronic printed circuit boards locally having semiconductor devices that generate a large quantity of heat, and to provide a computer on which the cooling apparatus is mounted.

Another object of the present invention is to prevent a rise of the cost of a computer having a jet cooling apparatus for cooling electronic equipment, to improve the cooling performance while maintaining the conventional maintenance facility and to reduce the pressure loss.

In order to achieve the foregoing objects, a jet cooling apparatus is provided for cooling electronic equipment having a plurality of printed circuit boards on each of which heat generating members such as IC chips, and LSI packages and the like are mounted, the apparatus comprising: air supply means for supplying air to the plurality of printed circuit boards; and a box-like member disposed upstream the plurality of the printed circuit boards, wherein the air supply means is disposed on one surface of the box-like member, and jet cooling means for supplying accelerated flow to the printed circuit boards is disposed on a surface of the box-like member facing the printed circuit boards. The jet cooling means are slits, nozzles projecting toward the printed circuit boards or duct projecting among the printed circuit boards.

A jet cooling apparatus for cooling electronic equipment comprises ducts disposed among printed circuit boards for the purpose of supplying cooling air to the surfaces of printed circuit boards from air supply means, and nozzles for supplying accelerated flow and disposed at positions in the ducts corresponding to the heat generating members of an electronic apparatus, the nozzles being disposed to have varied distances from the heat generating members depending upon the heating values of the heat generating members.

A jet cooling apparatus is provided for cooling electronic equipment including a plurality of electronic printed circuit boards, on which semiconductor devices, which are heat generating members, are mounted and which are stacked at predetermined intervals by supplying cooling airflows to the stacked electronic printed circuit boards, the apparatus comprising: an air supply fan attached to at least one wall forming a body of the cooling apparatus having a substantially flat three-dimensional space therein; and plurality of slits formed in parallel in another wall, of the cooling apparatus, opposing the air supply fan.

A computer, on which the foregoing jet cooling apparatus for cooling electronic equipment is mounted, comprises: a frame accommodating a plurality of electronic printed circuit boards, on each of which semiconductor devices, which are heat generating members, are mounted, and which are stacked at predetermined intervals in the frame; and cooling means for forming cooling airflows to be supplied to the plurality of stacked electronic printed circuit boards and disposed adjacent to the electronic printed circuit boards to cool the heat generating members, the cooling means being jet cooling means.

Another means is provided for achieving the foregoing objects of the present invention, wherein a plurality of electronic printed circuit boards, on each of which semiconductor devices, which are heat generating members, are mounted are stacked at predetermined intervals in a frame, and air supply means is disposed at side end faces of stacked printed circuit boards while interposing a chamber having a plurality of slit-like opened portions in parallel to the direction in which the printed circuit boards are arranged.

A computer comprises a frame accommodating a power source portion, a calculating portion, a storage portion and an input and output device, the calculating portion including a plurality of printed circuit boards on each of which heat generating members, such as IC chips and LSI packages and so forth, are mounted, air supply manes for supplying air to the plurality of printed circuit boards, and a box-like member disposed upstream of a plurality of the printed circuit boards, wherein the air supply means is disposed on one of the surfaces of the box-like member, and jet cooling means for supplying accelerated flow to the surfaces of the printed circuit boards is disposed on the surface of the box-like member facing the printed circuit boards.

That is, according to the foregoing cooling apparatus for cooling electronic equipment and a computer, on which the cooling apparatus is mounted, each according to the present invention, the jet cooling means serving as the jetting port of an air fan for generating cooling air can be formed in a front wall of the chamber, and the chamber can be disposed on the side of the stacked electronic printed circuit boards in place of positions above the stacked electronic printed circuit boards. Therefore, the size of the chamber can be considerably reduced. By forming the shapes of the jetting ports into slit-like, the flows through spaces among the electronic printed circuit boards can be smoothed. Furthermore, control of the dimensions of the slits enables the desired semiconductor device to be cooled concentratedly. In addition, provision of ribs in the chamber will make pressure distribution in the chamber to be further uniform. As a result, velocities of the jet flows can be equalized while eliminating the necessity of volume or capacity of the chamber.

Furthermore, the fan is disposed on one of the surfaces of the chamber and a multiplicity of nozzles are, as the jet cooling means, formed on the surface that faces the printed circuit boards in the direction toward the ICs and the packages which are heat generating devices. As a result, the cooling air supplied by the fan is jetted out from the nozzle to each of the heat generating devices while being formed into jet streams in accordance with the direction of the nozzles. The heat generating devices can be individually cooled. Furthermore, the dispersion of the flow can be reduced, resulting in that the necessity of providing a side plate or the like for covering the printed circuit boards can be eliminate. As a result, the maintenance of the printed circuit boards can be performed while preventing deterioration in the conventional workability.

Moreover, the jet stream ducts are, as the cooling means, provided among the printed circuit boards and jet stream ports for jetting out cooling air to a plurality of the heat generating devices in perpendicular to the direction of the duct are formed. As a result, the jet stream ports can easily be machined. In addition, even if dust or the like reaches the jet stream port, the cooling air can be supplied to each heat generating device. Therefore, an excessive rise in the temperature of the heat generating device due to clogging or the like can be prevented.

Furthermore, the provision of the duct so structured as to narrow the gap from a heat generating member that generates a large quantity of heat will enable jet streams, which are not dispersed, to be jetted against the heat generating device that generates a large quantity of heat. Therefore, cooling adaptable to the respective heating value of the heat generating members can be performed. Hence, the temperature distribution among the heat generating members can be made further uniform.

By providing a louver inclined upstream of the flow in an opened portion formed in the duct, the flow can be guided to the heat generating device while preventing a pressure loss.

BRIEF DESCRIPTION OF THE DRAWINGS

FIG. 4 is a sectional view taken along line A—A of FIG. 3;

FIGS. 9A and 9B respectively are a front elevational view and a sectional view (along line D—D) which illustrate another modification of the chamber with slits shown in FIG. 5 and according to the present invention;

FIG. 40A is a section along line R—R of FIG. 40B;

DESCRIPTION OF THE PREFERRED EMBODIMENTS

Preferred embodiments of the present invention will now be described in detail with reference to the drawings.

Figure 1:
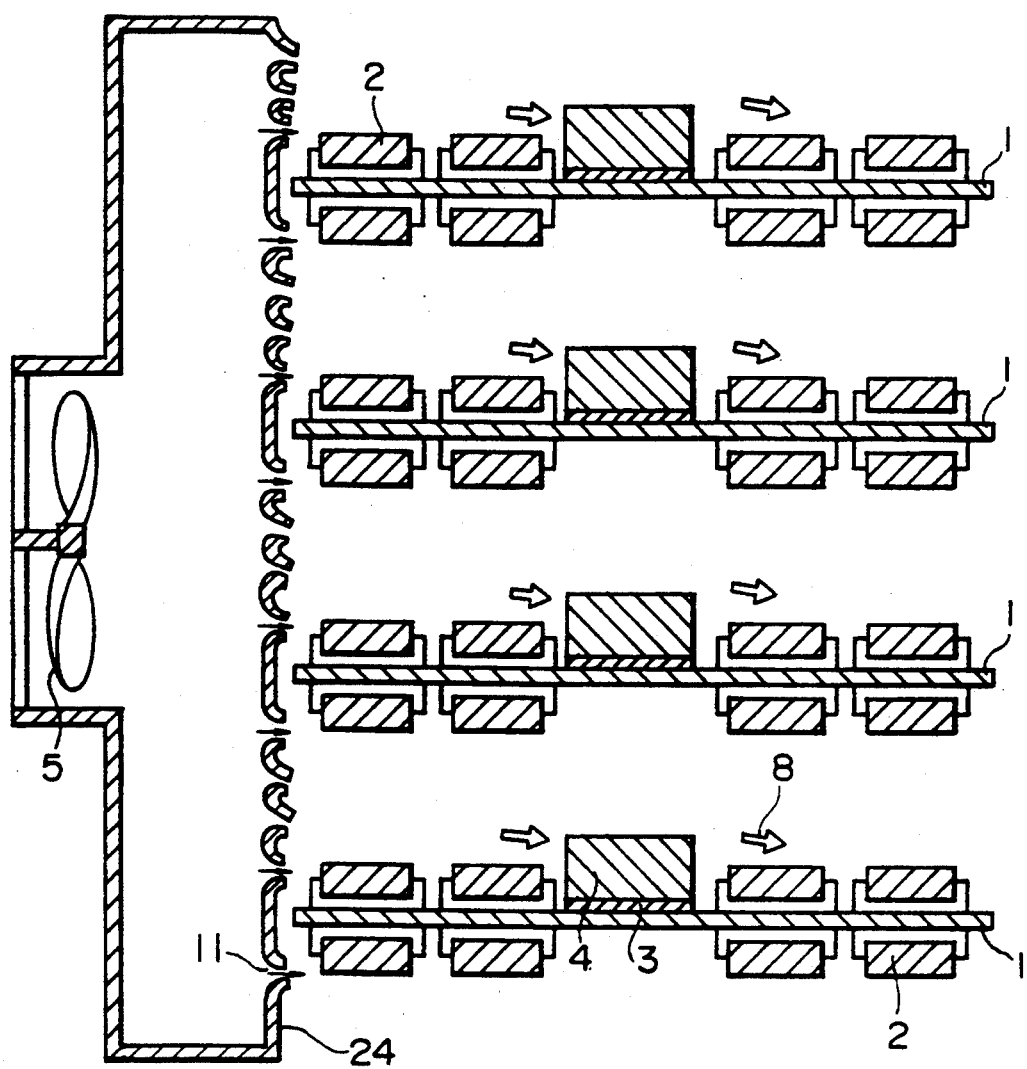
FIG. 1 is a sectional view which illustrates a cheer with nozzles as the jet cooling apparatus for cooling electronic equipment according to a first embodiment of the present invention.

FIG. 1 is a side elevational view which illustrates an electronic device having an arrangement that a chamber according to the present invention is used as a cooling apparatus. Referring to FIG. 1, the electronic device employs a structure constituted by stacking in parallel a multiplicity of layers (four according to this embodiment) of printed circuit boards 1 on each of which a plurality of electronic circuit elements are mounted on the two sides thereof. On the printed circuit board 1, a plurality of IC chips 2 and a package 3 having cooling fins 4 surrounded by the IC chips 2 are arranged and mounted.

A chamber 24 according to the present invention is disposed on the side (on the left hand side according to the embodiment illustrated) of the printed circuit boards 1 stacked at intervals. As can be seen from FIG. 1, the chamber 24 incorporates a so-called axial flow fan 5 fastened on a side surface of chamber body formed into a relatively flat three-dimensional space as shown in FIG. 1, while having a plurality of nozzles 11 disposed on the other side surface opposing the fastened axial flow fan 5.

Cooling air 8 sent from the fan 5 is jetted out from the nozzles 11 of the chamber 24, and accelerated by the nozzles 11 followed by colliding with each heat generating member 2 or 3. The size and the air jetting-out direction of each nozzle 11 are changed to be adaptable to heating values and positions of the IC chips 2 and the packages 3. For example, the intervals between the nozzles 11 are so determined that air from the nozzle 11 positioned at an intermediate position between the printed circuit boards 1 cools the remote IC chip(s) and air from the nozzles 11 adjacent to the printed circuit board 1 cools the adjacent printed circuit board 1. The suction port of each nozzle 11 is formed into a curved shape.

Since the structure is constituted as described above, the cooling air 8 is sent through the nozzles 11 into directions toward the disposed heat generating members 2, 3. As a result, wasteful cooling air which is passed merely through a space between the printed circuit boards 5 can be minimized and accordingly the cooling air 8 can be effectively used as compared with a conventional structure in which the air is allowed to flow in parallel to the printed circuit boards 5. Furthermore, the collision of the accelerated air with the heat generating members 2, 3 raises the heat transfer ratio and improves the cooling performance. Since the arrangement that the size of the nozzle 11 is varied to be adaptable to the heating value of each of the heat generating members 2, 3, the temperature distribution among heat generating members 2, 3 can be made uniform. Moreover, the employed curved shape of the suction port of the nozzle 11 enables an advantage to be obtained in that the pressure loss of the passage can be reduced, causing the power required to rotate the fan 5 for supplying the cooling air to be reduced. Furthermore, the arrangement in which the printed circuit boards 1 and the chamber 24 can be separated from each other enables a maintenance work to be performed as it is while eliminating a necessity of removing or moving the chamber at the time of maintaining the printed circuit boards 1. As a result, the working efficiency is not reduced.

The surface of the chamber 24 adjacent to the printed circuit boards 1 may be provided with grooves or holding members to which the printed circuit boards 1 are placed to assuredly hold the printed circuit boards 1. In this case, an effect of further stably holding the printed circuit bards 1 can be obtained.

Figure 2:
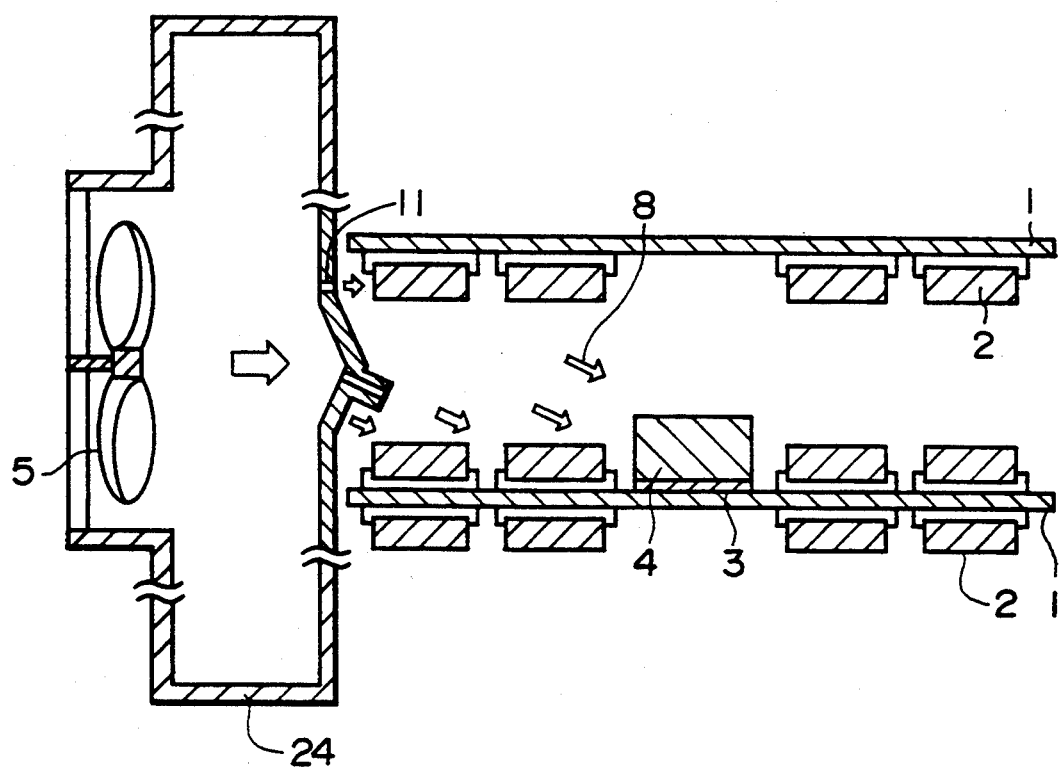
FIG. 2 is a sectional view which illustrates a chamber with nozzles as the jet cooling apparatus for cooling electronic equipment according to a second embodiment of the present invention.

FIG. 2 is a partial sectional view which illustrates a second embodiment of the present invention. Similarly to FIG. 1, groups of IC chips 2 and package(s) 3 are placed on the printed circuit boards 1, the packages 3 respectively having the heat radiating fins 4 mounted thereon. The box-like cooling-air supplying chamber 24 is so disposed as to be separated from the printed circuit boards 1. The chamber 24 has the fan on one side thereof and nozzles 11 on the other side thereof. A plurality of the printed circuit boards 1 disposed at certain intervals are fixed to an other portion (not shown), that is, in a vertical direction in the arrangement of the embodiment shown in FIG. 2. The cooling air 8 is jetted out through nozzles 11 of the chamber 24, and accelerated by the nozzles 11 to collide with each of the heat generating members 2, 3. The size and the air jetting-out direction of each nozzle 11 are changed to be adaptable to the heating values and the positions of the IC chips 2 and the packages 3. This embodiment is different from the first embodiment shown in FIG. 1 on a point that each nozzle 11 is formed into a circular hole which does not require high accuracy.

Since the structure is constituted as described above, the cooling air 8 is sent through the nozzles 11 into directions toward the disposed heat generating members 2, 3. As a result, wasteful cooling air can be minimized and accordingly the cooling air 8 can be effectively used as compared with a conventional structure in which the air is allowed to flow in parallel to the printed circuit board 1. Furthermore, the collision of the accelerated cooling air 8 with the heat generating members 2, 3 raises the heat transfer ratio and improves the cooling performance. Since the arrangement that the size of the nozzle 11 is varied to be adaptable to the heating value of each of the heat generating members 2, 3, the temperature distribution among heat generating member can be made uniform. Furthermore, the arrangement in which the printed circuit boards 1 are secured to the member separate from the chamber 24 enables the working efficiency not to be reduced at the maintenance work. Therefore, an excessive machining accuracy is not required and the cooling performance can be improved.

Figure 3:
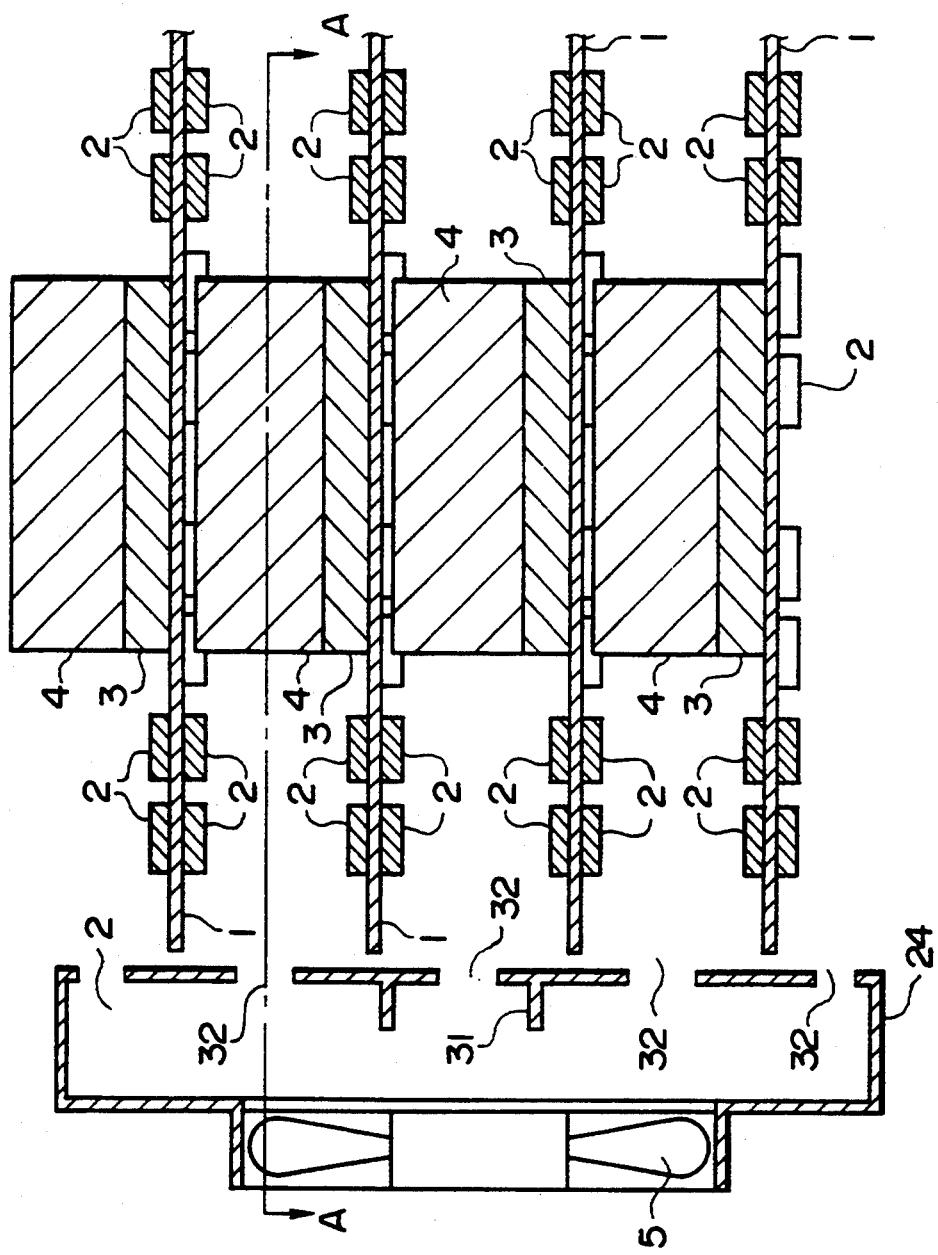
FIG. 3 is a sectional view which illustrates a structure of a jet cooling apparatus for cooling electronic equipment according to a third embodiment of the present invention.

FIG. 3 illustrates a third embodiment of the present invention having an arrangement that the structures of the printed circuit boards 1, the chamber 24 and the fan 5 are the same as those according to the first and the second embodiments. However, the difference from the foregoing embodiments lies in that rectangular slits 32 are formed in the chamber 24. The chamber 24 includes ribs 31 formed therein.

FIG. 4 illustrates printed circuit boards loaded in this embodiment, FIG. 4 being a sectional view taken along line A—A of FIG. 3. The detailed structure of the chamber 24 constituted as described above will now be described with reference to FIGS. 5A and 5B.

Figure 5B:
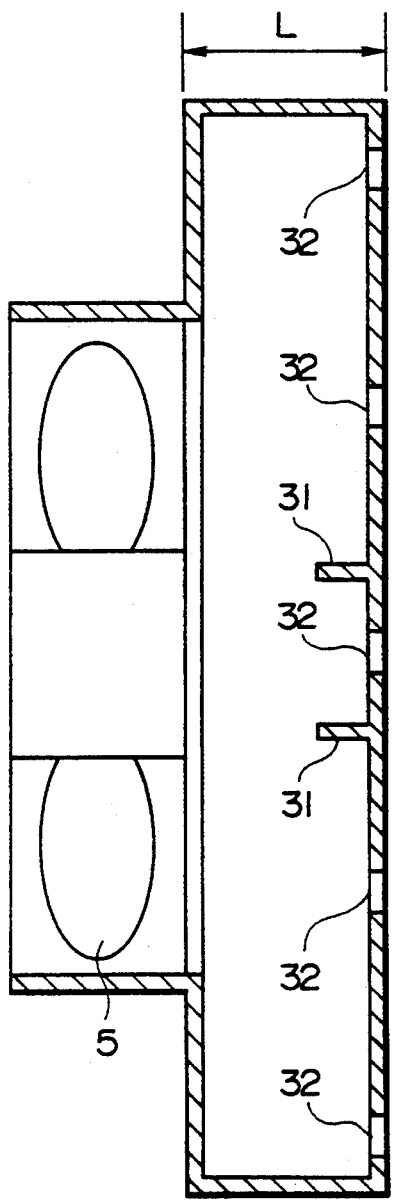
FIGS. 5A and 5B respectively are a front elevational view and a horizontal sectional view (along line B—B) which illustrate the internal structure of the chamber with slits for use in electronic equipment.
Figure 5A:
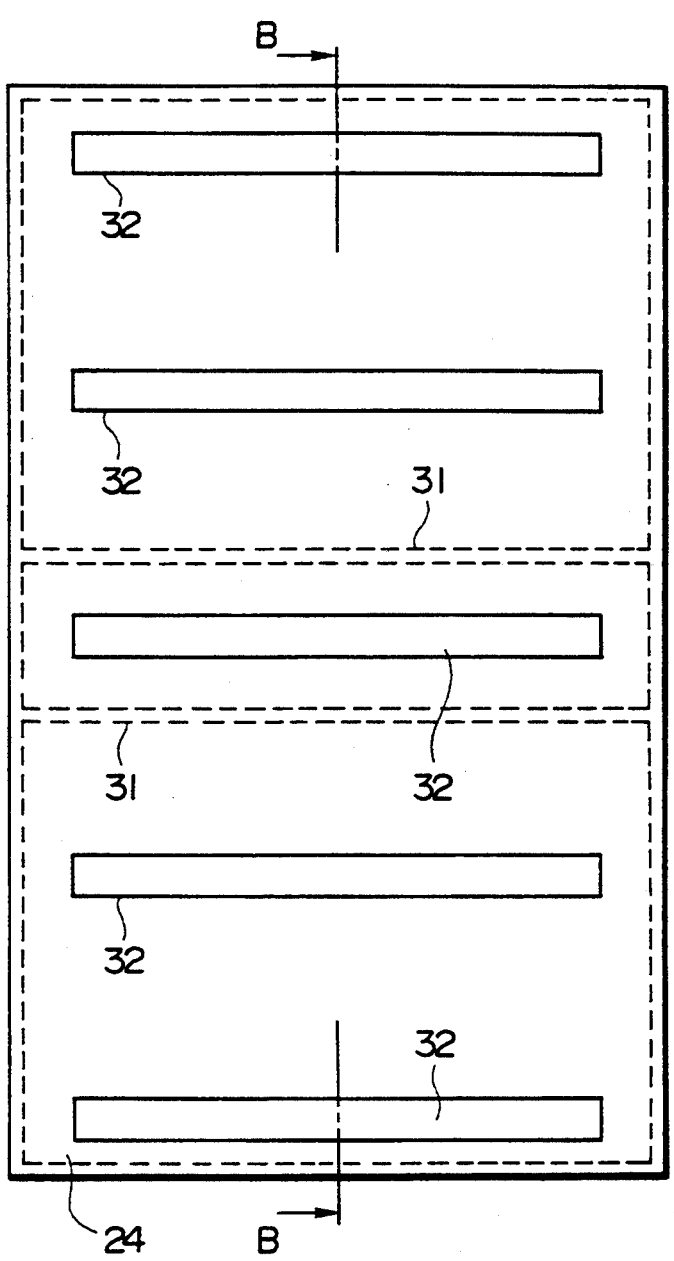

FIG. 5A is a front elevational view which illustrates are shape of the slits 32 and the like of the chamber 24. FIG. 5B is a sectional view taken along line B—B of FIG. 5A. As shown in FIGS. 5A and 5B, five slits 32 are formed in the front wall of the chamber 24 at the same intervals. Two ribs 31 are so formed to project over the inner wall of the chamber 24 at vertical positions interposing the central slit 32 therebetween while maintaining the same distances from the central slit 32. Furthermore, an axial flow fan 5 is disposed on the vertical wall of the chamber 24 opposing the wall in which the slits 32 are formed, the axial flow fan 5 being so disposed that its center coincides with the center of the central slit 32.

Figure 6:
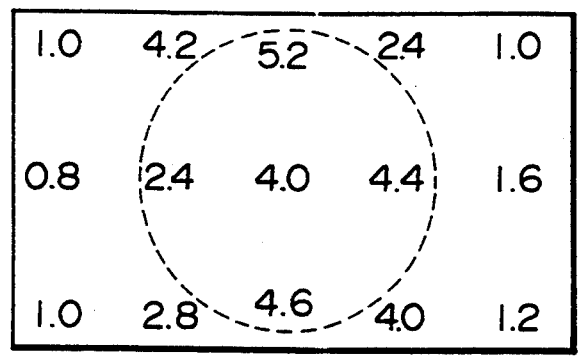
FIG. 6 illustrates the measured values of the distributed air velocity at the positions of outlet ports of the chamber without slits to comparatively describe the operational principle of the present invention.

In order to understand the principle of the invention, the airflow distribution realized by the foregoing axial flow fan 5 will now be described. FIG. 6 illustrates results of measurements of the air speed distribution at 15 points which are the multiple of five points in the horizontal direction and three points in the vertical direction realized in a case where the outlet ports of the chamber are not devised. FIG. 6 illustrates the results at the corresponding measured points. As shown in FIG. 6, the air speed distribution is considerably dispersed or varied depending upon the positions in the case where the outlet port of the chamber is not devised. More specifically, the results of the measurements of the air speeds were obtained as follows: an axial flow fan having a size of 80 mm×80 mm and a thickness of 25 mm was fastened to a board having a size of 130 mm×85 mm and rotated at a rated voltage of 12 V while discharging the air to open atmosphere.

Figure 7A:
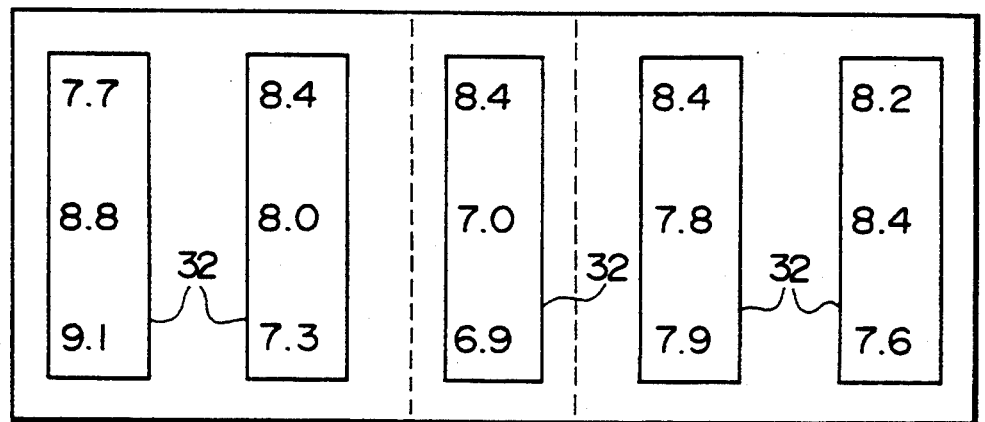
FIGS. 7A and 7B illustrate the measured values of the distributed air velocities at each slit position describe uniform airflows realized by the chamber according to the present invention.
Figure 7B:
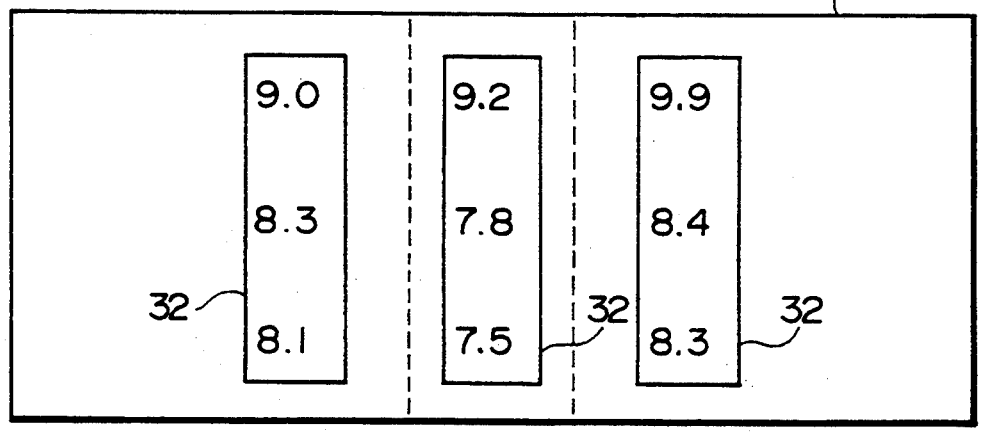
Figure 8B:
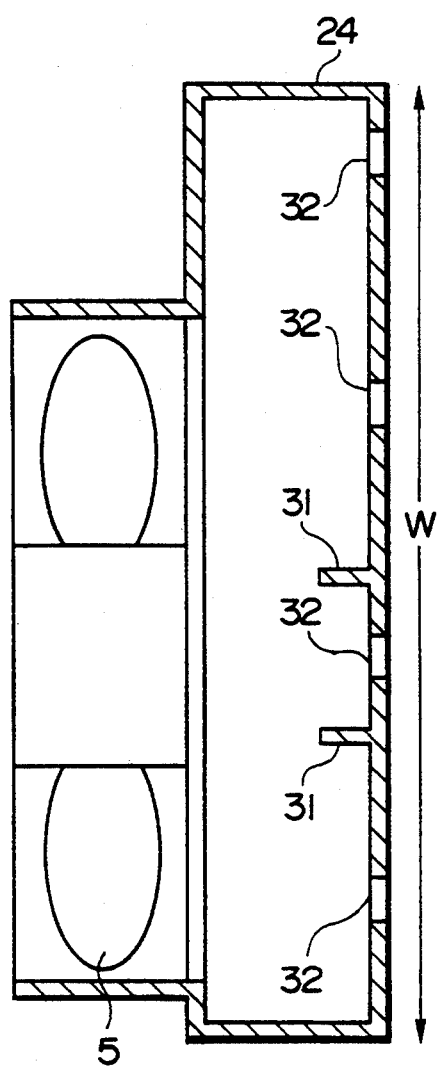
FIGS. 8A and 8B respectively are a front elevational view and a sectional view (along line C—C) which illustrate a modification of the chamber with slits shown in FIG. 5 and according to the present invention.
Figure 8A:
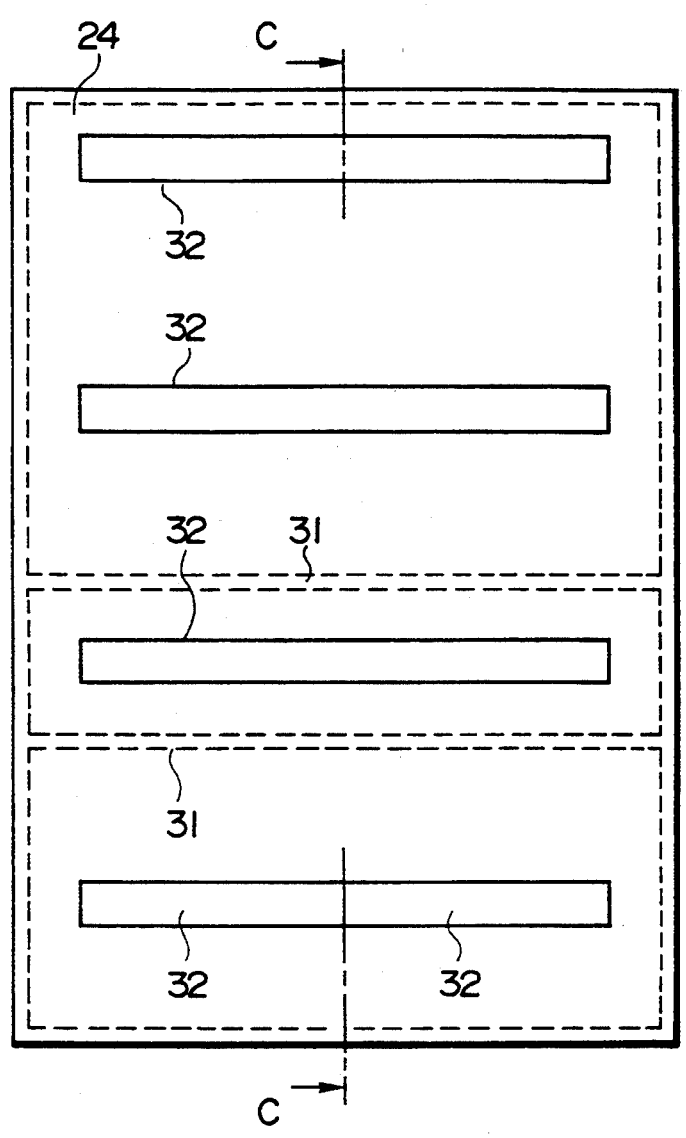

On the other hand, the present invention enables the air speed distribution at the outlet ports to be uniform thanks to the slits 32 of the chamber 24 while eliminating a necessity of thickening the thickness L of the duct. The fact is shown in FIGS. 7A and 7B. That is, FIG. 7A illustrates the air speed distribution at the outlet ports of the slits 32 of the chamber 24 shown in FIG. 5. In this case, the same axial fan 5 used in the measurements, the results of which are shown in FIG. 6, was used, the axial fan 5 being rotated at the same rated voltage of 12 V. The inner dimensions of the chamber are as follows: the thickness is 25 mm; the height is 130 mm; and the width is 85 mm. The slit has a width of 5 mm and a length of 65 mm. The rib 31 is 8 mm high. It should be note that the foregoing dimensions are taken as an example and accordingly the present invention is not limited to the dimensions. For example, the width of the slit 32 may be changed from 5 mm to 7 mm to realize a similar speed distribution to the illustrated results. Furthermore, the height of the rib 31 may be changed to 5 mm or 10 mm to obtain similar results.

That is, it is apparent that the chamber 24 according to the present invention is able to considerably improve the uniformity of the speed distribution of the cooling airflows as compared with the air speed distribution (see FIG. 6) realized when the axial flow fan 5 is not accommodated in the chamber. Even if the two terminative slits 32 of the chamber having the foregoing slits were closed, a satisfactorily uniform air speed distribution at the outlet ports was obtained as shown in FIG. 7B.

Figure 10A:
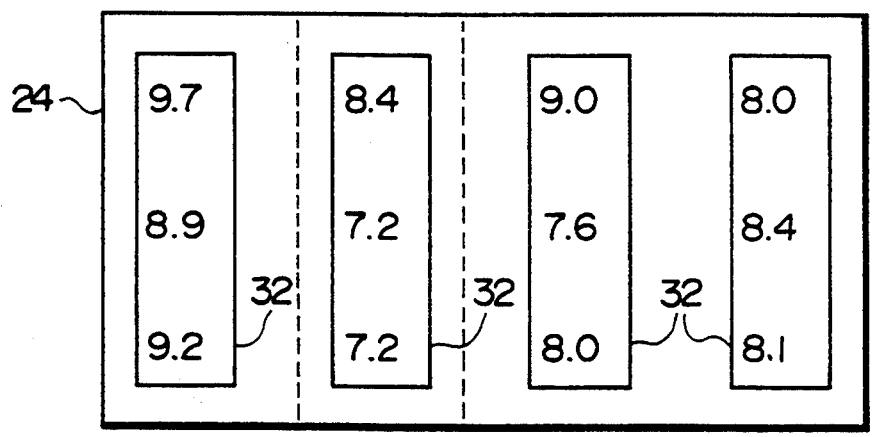
FIGS. 10A and 10B illustrates the measured values of the distributed air velocities at each slit position according to the modifications shown in FIGS. 8 and 9.
Figure 10B:
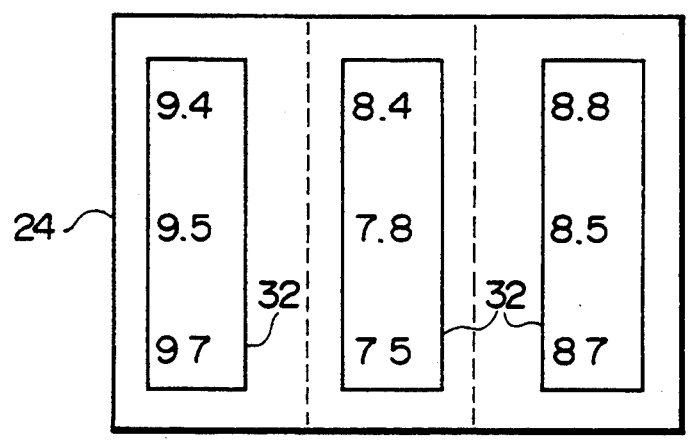

FIGS. 8A, 8B and 9A, 9B illustrate a structure in which the number of the slits 32 is decreased as compared with that according to the embodiment shown in FIG. 5 but the duct length W is shortened to compensate the decrease in the number. The state of the air speed distribution at the outlet ports of the slits is shown in FIGS. 10A and 10B. Specifically, the duct length W=110 mm in the case shown in FIG. 8, while W=89 mm in the case shown in FIG. 9. The residual dimensions are the same in the case shown in FIG. 8 and in the case in FIG. 9. Even if the chamber having the modified slits 32 is used, a substantially uniform air speed distribution at the outlet ports can be, as shown in FIGS. 10A and 10B, obtained according to the present invention.

Referring back to FIGS. 3 and 4, a cooling effect of the electronic apparatus which employs the chamber 24 according to the present invention and capable of enabling the speed distribution of the cooling airflows at the output ports of the slits to be uniform will now be described. Specifically, the cooling effect obtainable from the structure in which a plurality of the printed circuit boards 1 are stacked will now be described. As can be understood from FIG. 3 which shows the printed circuit boards 1 viewed from a side position, a plurality of the slits 32 in the front wall of the chamber 24 are disposed between corresponding printed circuit boards 1. Furthermore, the width and the configuration of the slits 32 are so set as shown in FIG. 4 as to substantially cover a range of the IC chips 2 such as memory chips and the package 3 such as CPU which must be cooled. As a result, the cooling airflows can be concentrated to the portions which must be cooled.

In this case, each of the devices 2, 3 generates heat, the value of which is as follows: each of the memories 2 generates a heating value of about 0.5 W for example; and the CPU 3 generates a heating value of about 20 W.

As a result, heat of a total heating value no less than 30 W is generated. However, the slits 32 of the chamber 24 are properly adjusted as described above to concentrate the cooling airflows to the CPU 3 serving as a high heat generator, thus resulting in a satisfactory cooling effect to be obtained. In the case where the memories 2 and the CPU 3 are mounted on the two sides of each printed circuit board 1, it is preferable that the printed circuit boards 1 are positioned between the slits 32 of the chamber 24. If the memories 2 and the CPU 3 are mounted on only one side of each printed circuit board 1, it is preferable that the slits 32 are positioned above the surfaces of the printed circuit boards 1 on which the foregoing devices 2, 3 are mounted.

Since the structure of the chamber 24 according to the present invention throttles the cooling airflows generated by the axial fan 5 by the slits 32 thereof to accelerate the airflows, excellent heat transfer performance can be obtained while necessitating only a small quantity of flow. Therefore, the embodiment shown in FIGS. 3 and 4 enables the cooling performance equivalent to a conventional cooling system to be obtained while necessitating only about ¼ to 1/5 of the quantity of flow, the conventional cooling system having an arrangement that the cooling airflows to the overall space between the boards. Furthermore, this embodiment requires to simply provide the chamber 24 on the ends side of a plurality of the stacked printed circuit boards 1. Furthermore, a necessity of arranging a duct over a long distance can be eliminated. As a result, the following practical advantages can be obtained in that the mounting process can be considerably simplified as compared with the conventional process to prepare an arrangement that the duct is disposed above the printed circuit boards, and that the printed circuit boards can be disposed in the same way as the conventional parallel airflow system in which the cooling air flows through the overall space in which the printed circuit boards are disposed.

Figure 11B:
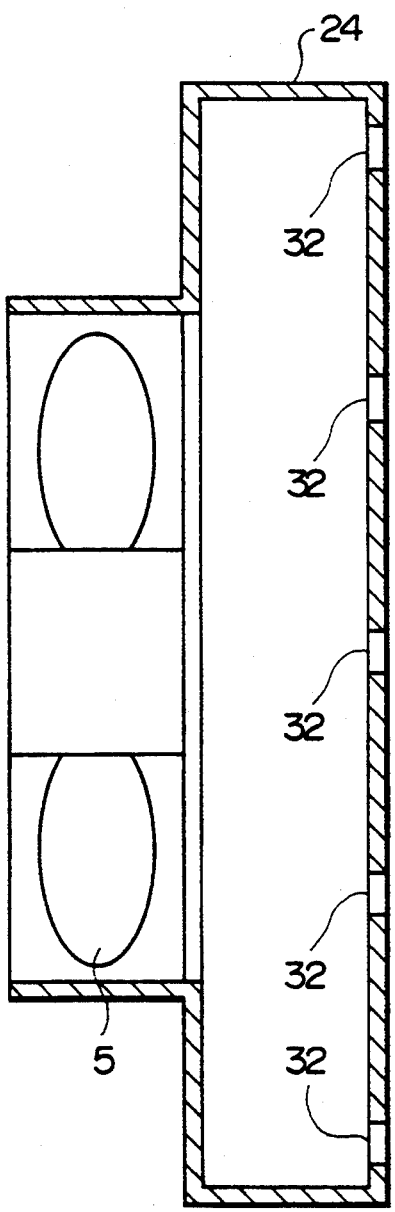
FIGS. 11A and 11B respectively are a front elevational view and a sectional view (along line E—E) which illustrate the detailed internal structure of a chamber with slits according to another embodiment of the present invention.
Figure 11A:
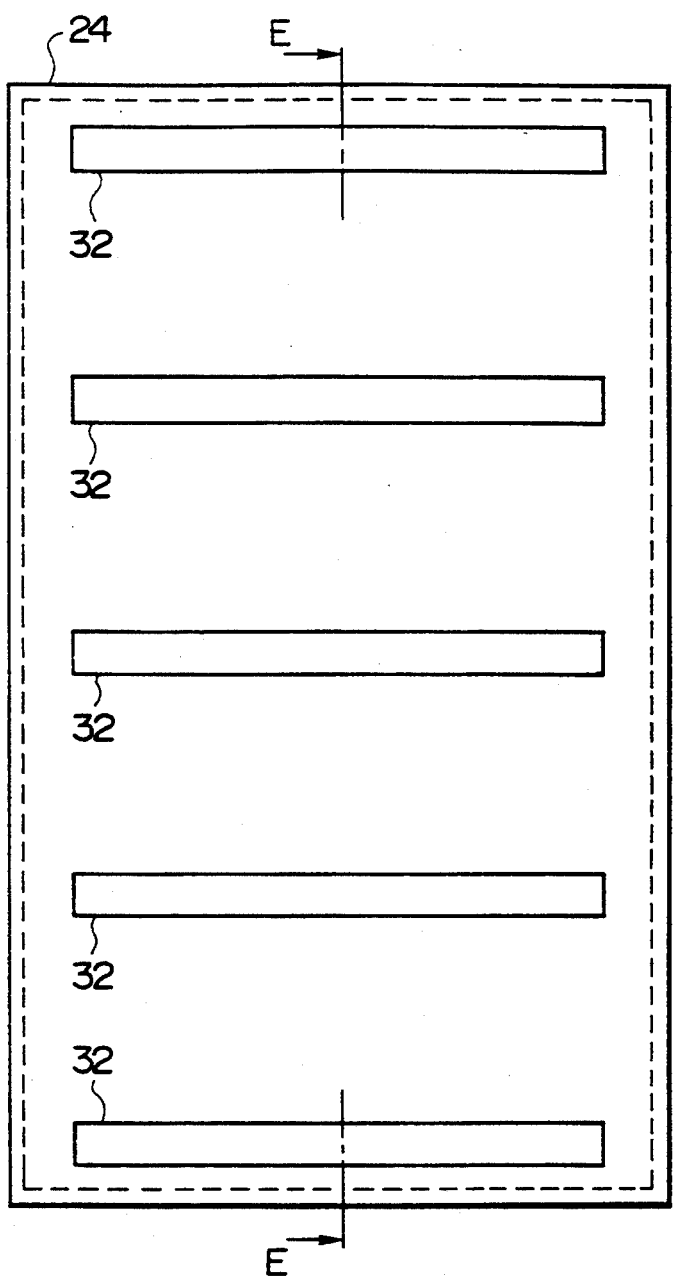
Figure 12A:
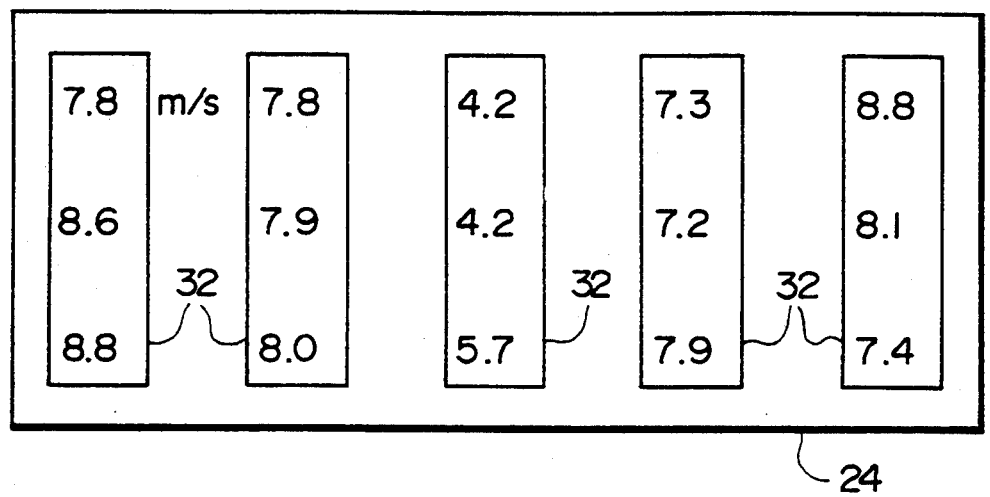
FIGS. 12A and 12B illustrate the measured values of the distributed air velocities at each slit position according to another embodiment and its modification of the present invention.
Figure 12B:
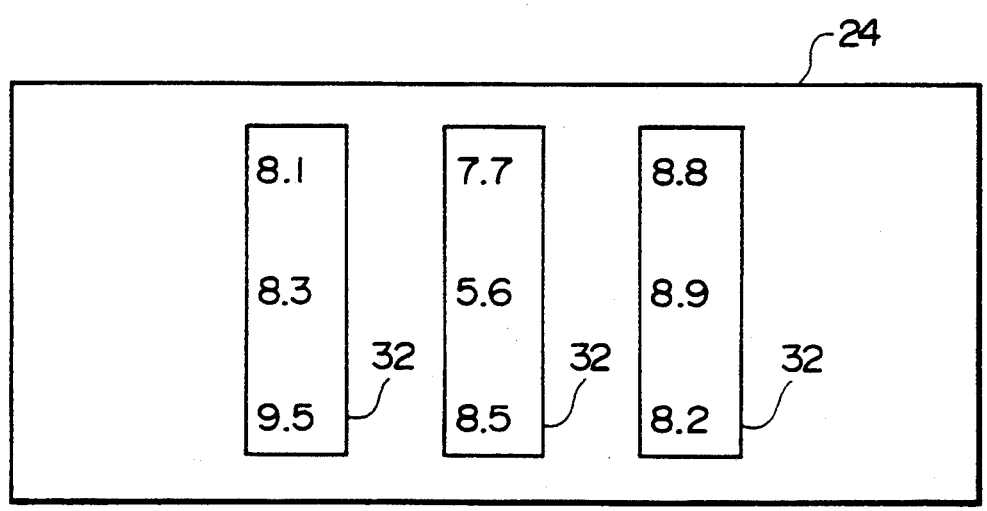

FIGS. 11A and 11B illustrate the structure of a chamber having slits according to a modification of the third embodiment of the present invention. The chamber 24 according to this embodiment has an arrangement that the ribs 31 are not formed on the inner wall of the chamber 24. Another modification (not shown) may be employed in which the two terminative slits 32 among a plurality of (e.g. five) slits 32 formed in the wall of the chamber 24 are omitted. In the foregoing cases including the modification in which the ribs 31 on the inner wall are omitted, the flow velocity (speed) distribution shown in FIGS. 12A and 12B are attained. As can be seen from the illustrated state of the flow velocity distribution, although the flow velocity at the slit 32 disposed on the central axis of the axial flow fan 5 is lowered slightly, substantially uniform flow velocities are realized. The dimensions of the chamber 24 shown in FIG. 11 from which the flow velocity distribution shown in FIG. 12 was attained have the same dimensions as that shown in FIG. 7 except for an arrangement the ribs 31 are omitted. That is, the ribs 31 are omitted from the inside portion of the chamber 24 and accordingly an advantage can be obtained in that the structure of the chamber 24 can be simplified.

Figure 13B:
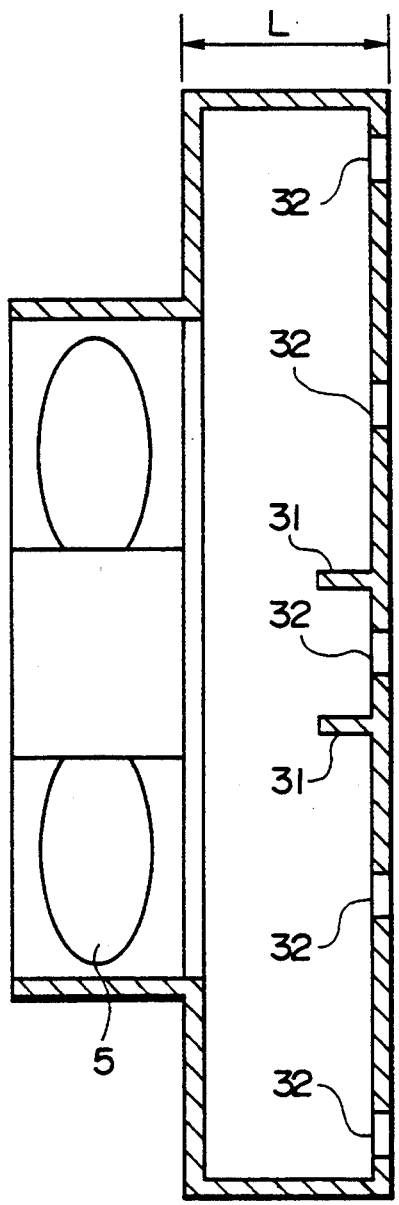
FIGS. 13A and 13B respectively are a front elevational view and a sectional view (along line F—F) which illustrate the detailed internal structure of a chamber with slits according to still another embodiment of the present invention.
Figure 13A:
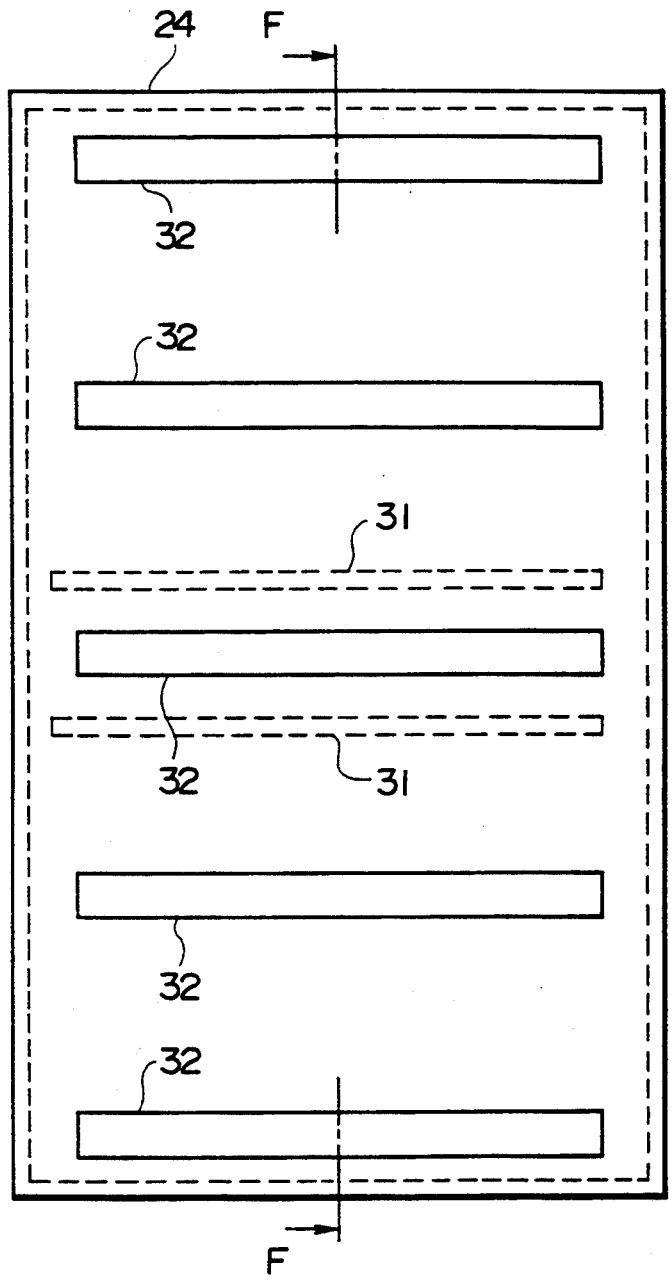

FIGS. 13A and 13B illustrate a chamber according to another modification of the present invention. According to this modification, the length of each rib 31 is made to be shorter than that of the chamber 24 as can be clearly seen from FIG. 13A. Also the foregoing structure enables substantially uniform velocity distribution at the jetting ports 32 to be obtained.

Figure 14B:
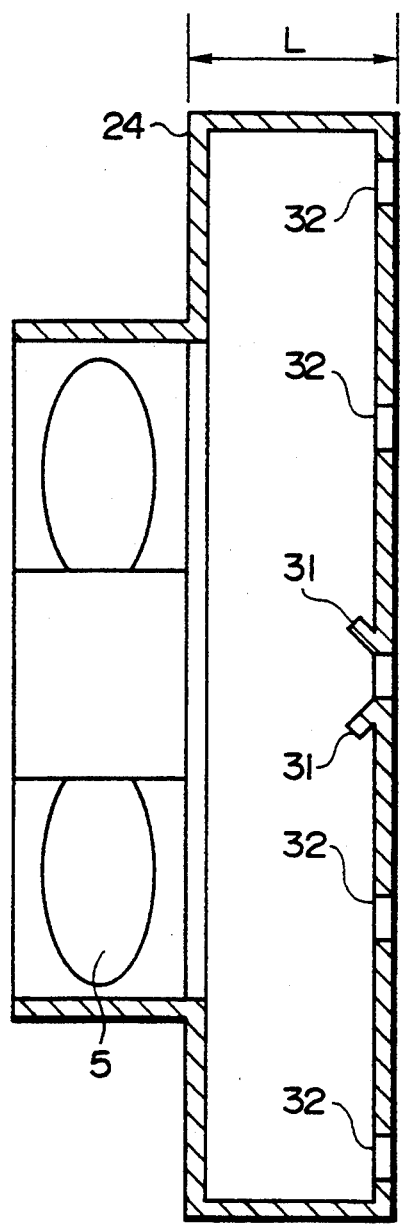
FIGS. 14A and 14B respectively are a front elevational view and a sectional view (along line G—G) which illustrate the detailed internal structure of a chamber with slits according to still another embodiment of the present invention.
Figure 14A:
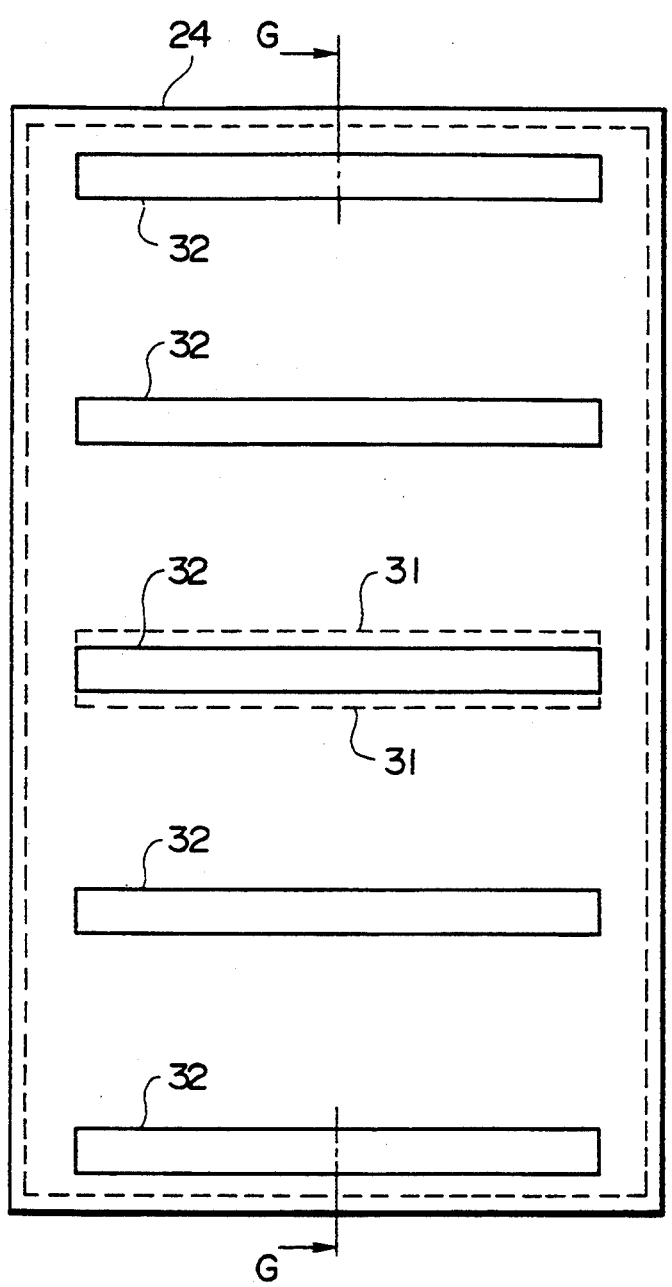

FIGS. 14A and 14B illustrate still another modification of the present invention. According to this modification, the length of each rib 31 is made to be the same as that of the slits 32, the ribs 31 being opened in the opposing directions. In a case where the body of the chamber 24 is formed by a sheeting work, the ribs 31 according to this embodiment can be formed simultaneously with the work for punching out the slits in a manner that either side portion of the sheet is bent. Therefore, an advantage can be obtained in that the ribs 31 can easily be formed.

Figure 15B:
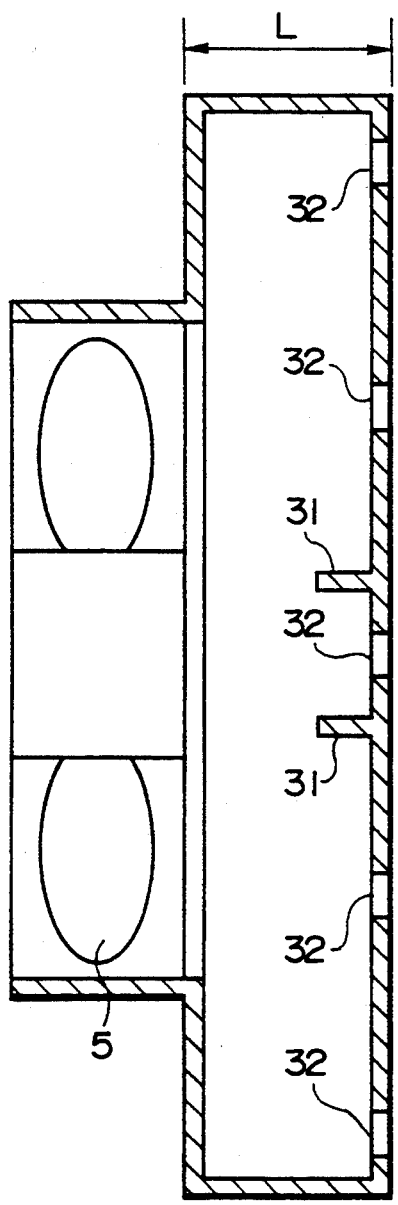
FIGS. 15A and 15B respectively are a front elevational view and a sectional view (along line H—H) which illustrate the structure of a modification in which the lengths of the slits of the chamber with slits are changed.
Figure 15A:
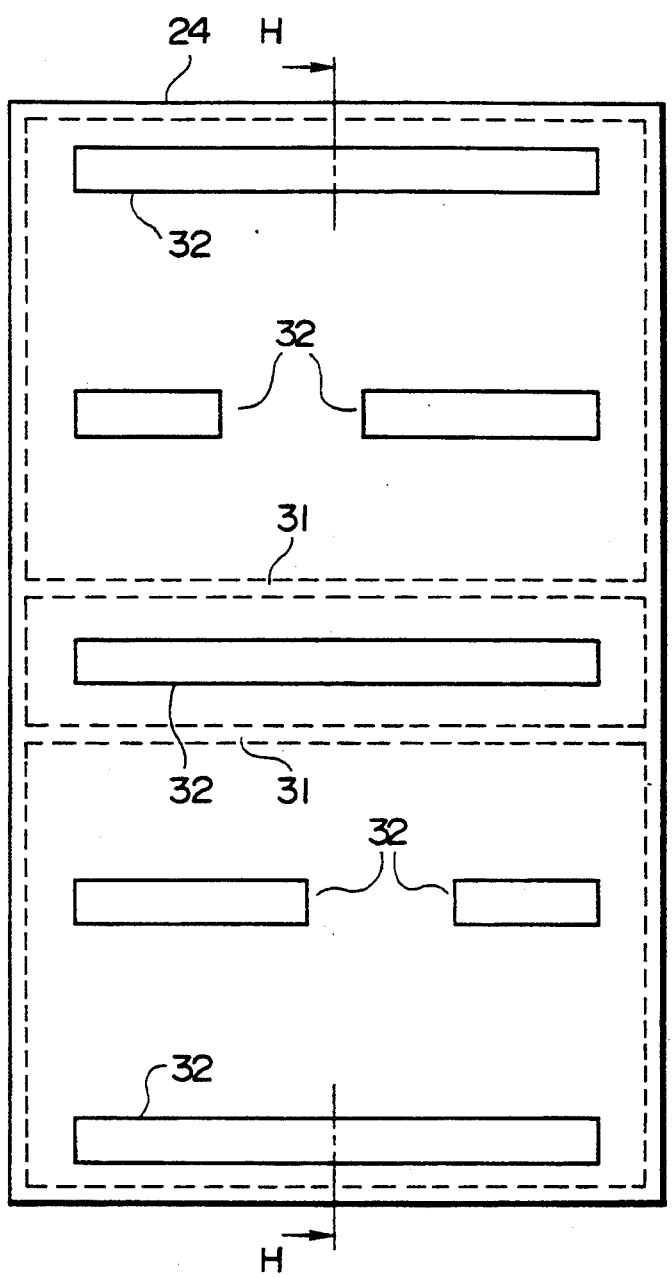
Figure 16B:
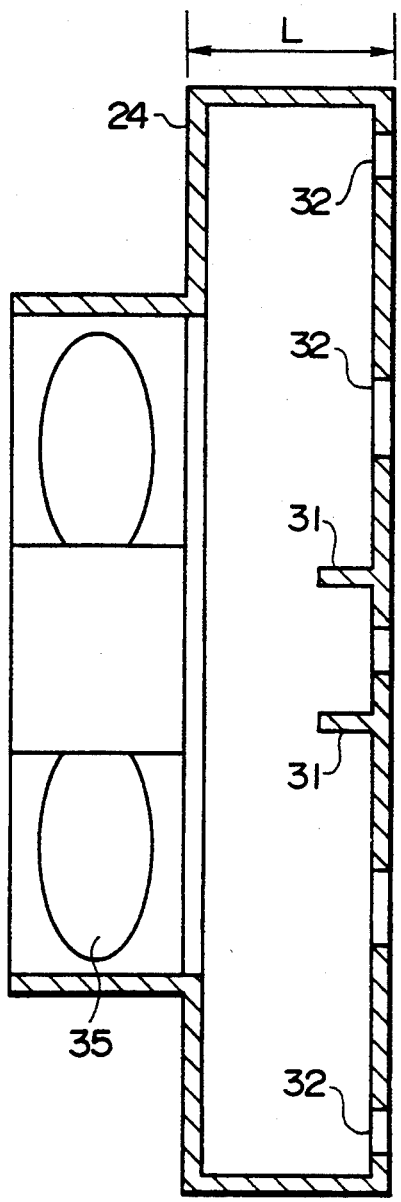
FIGS. 16A and 16B respectively are a front elevational view and a sectional view (along line I—I) which illustrate the structure of a modification in which the widths of the slits of the chamber with slits are changed.
Figure 16A:
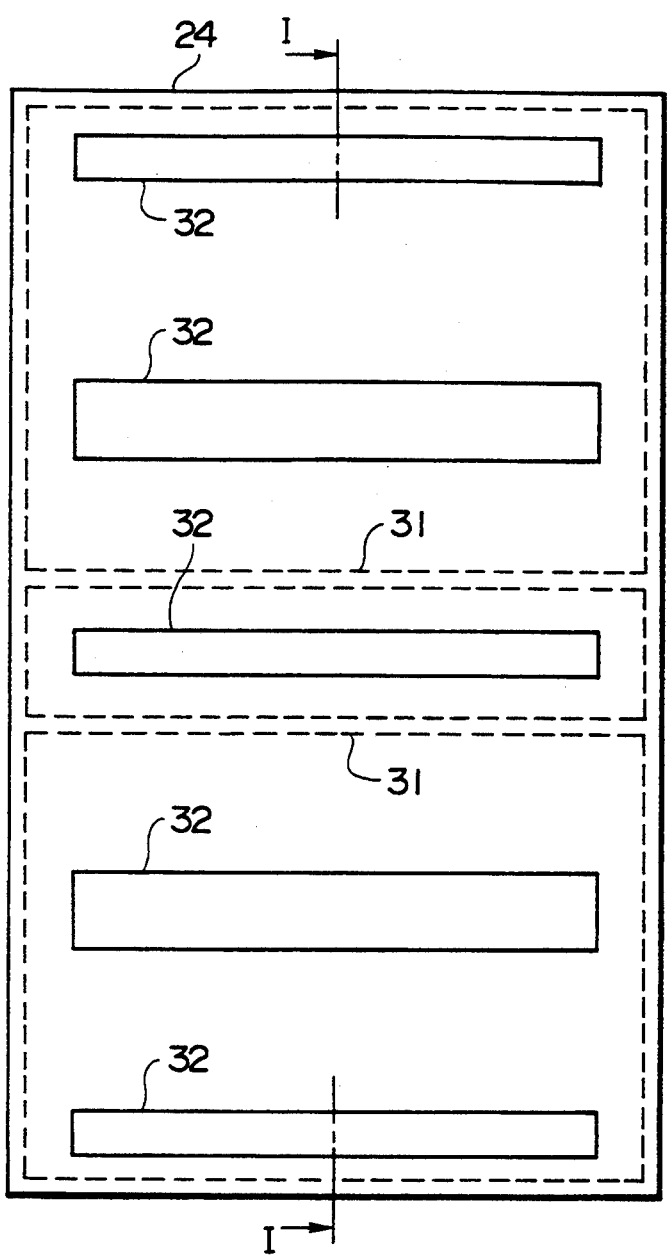
Figure 17B:
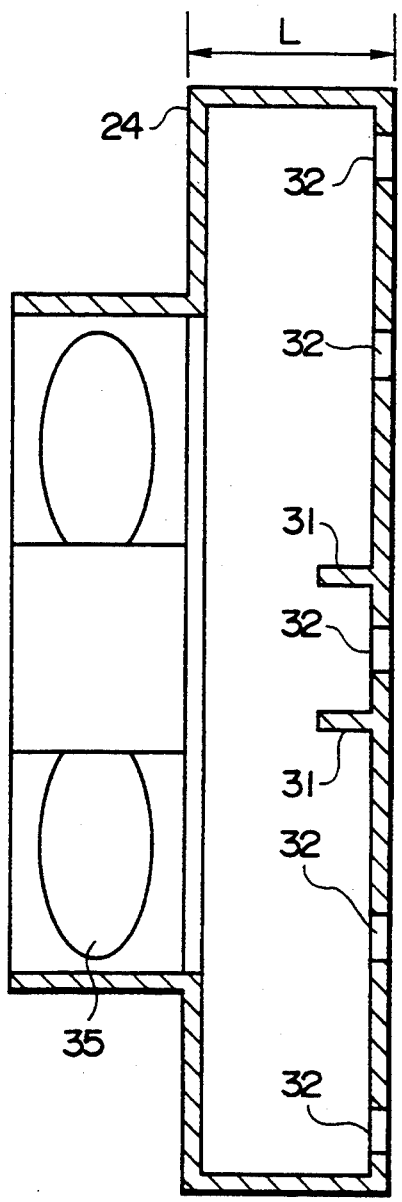
FIGS. 17A and 17B respectively are a front elevational view and a sectional view (along line J—J) which illustrate the structure of a modification in which the intervals of the slits of the chamber with slits are changed.
Figure 17A:
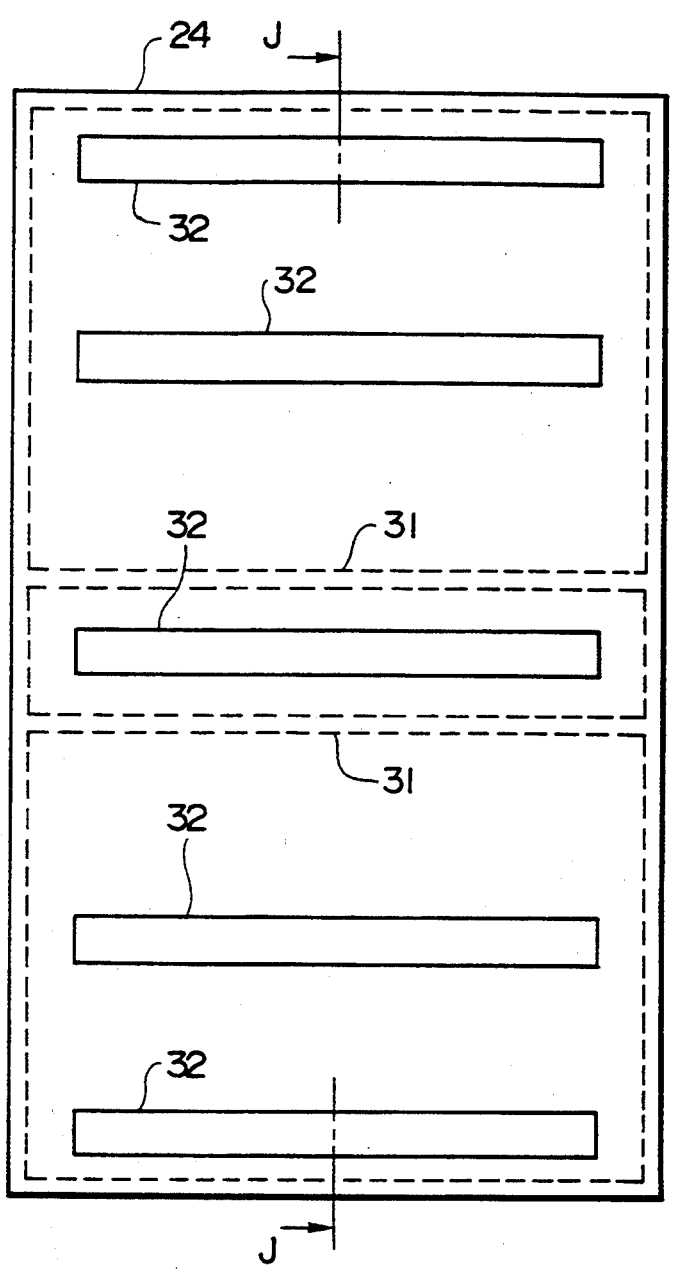
Figure 18:
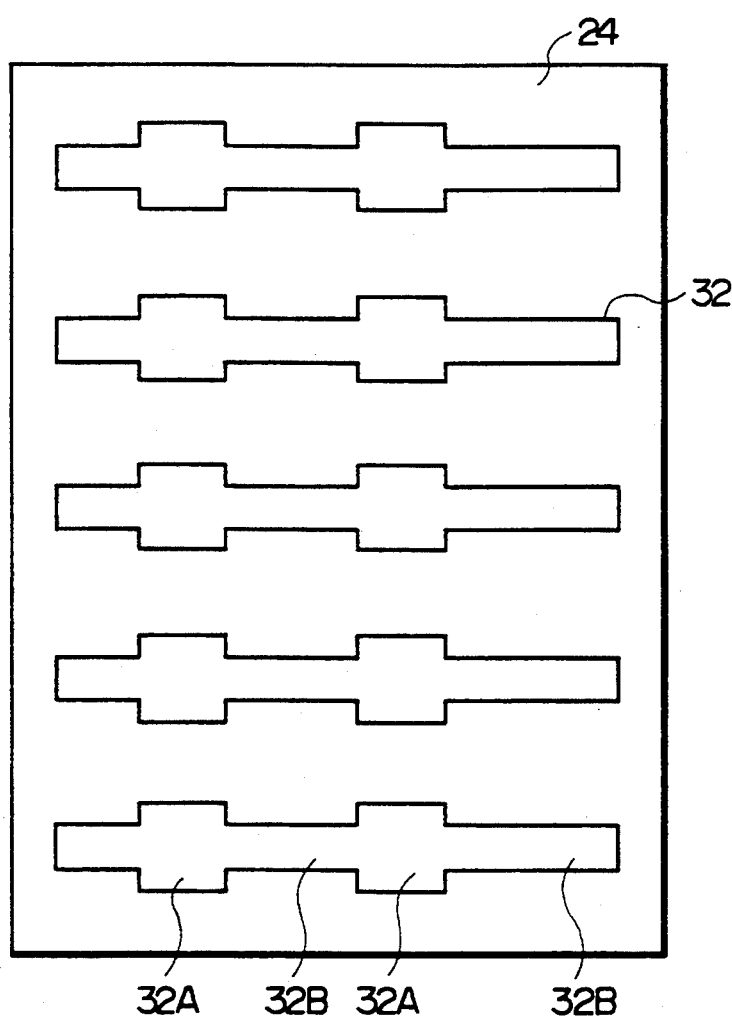
FIG. 18 is a front elevational view which illustrates the structure of a modification in which the shapes of the slits of the chamber with slits are changed.

Although each of the foregoing embodiments has an arrangement that a plurality of the slits 32 formed in the front wall of the chamber 24 have the same size and are disposed at the same or regular intervals, the present invention is not limited to the aforesaid structure or arrangement. For example, an embodiment shown in FIGS. 15A and 15B has an arrangement that slits 32 have different lengths or are divided into plural sections to be adaptable to the configuration of the devices 2, 3 on the printed circuit boards 1 to be cooled. FIGS. 16A and 16B illustrate an embodiment having an arrangement, adaptable to a case where the printed circuit boards 1 respectively generate different heating values, by changing the widths of the slits 32 for forming the cooling airflows to control the quantity of the flow. FIGS. 17A and 17B illustrate an embodiment having an arrangement, adaptable to a case where the intervals between the printed circuit boards 1 stacked in the frame or the like are different, by changing the intervals of the slits 32. FIG. 18 illustrates an embodiment having an arrangement that the horizontal shape of each slit 32 is varied in the following manner that the portions 32A of each slit 32 for cooling the members, such as the CPU, that generate heat of a large heating value, are widened and the portions 32B for cooling the members such as the memories are narrowed.

Figure 19:
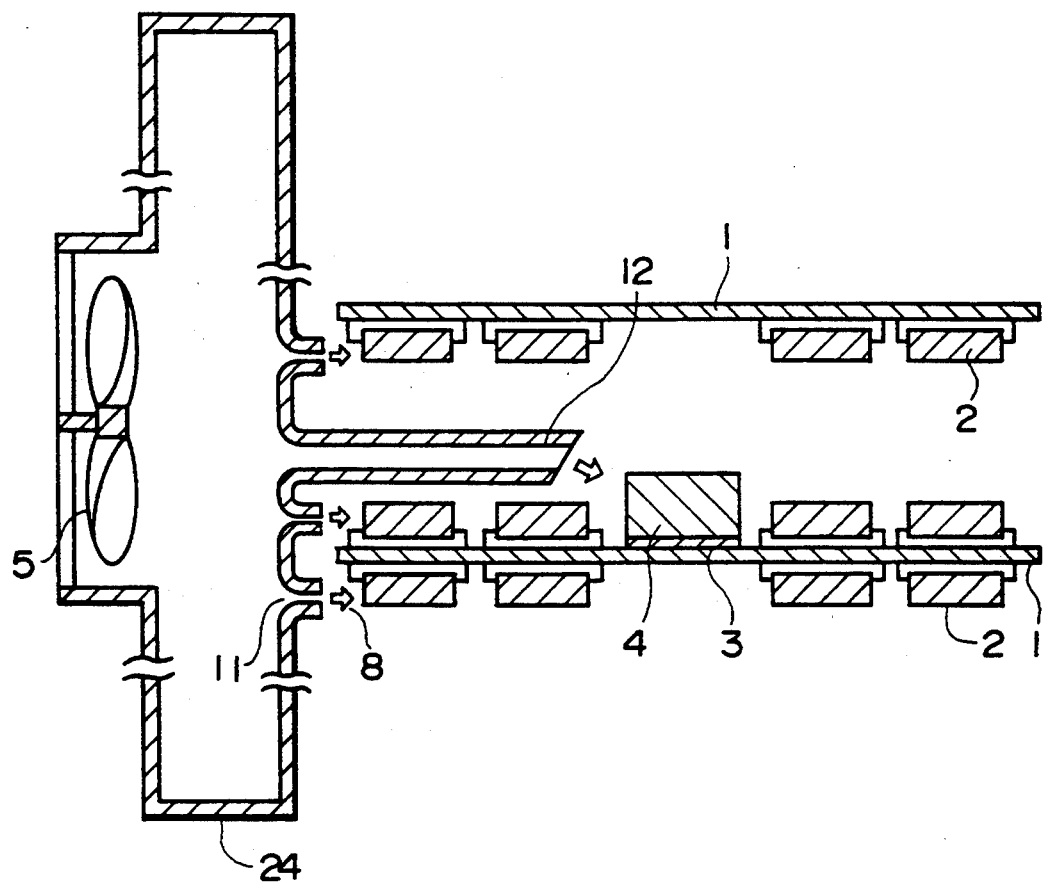
FIG. 19 is a sectional view which illustrates a chamber with nozzles according to a fourth embodiment of the present invention.

FIG. 19 illustrates a fourth embodiment of the present invention having an arrangement that nozzles provided for the chamber are projected to spaces between the printed circuit boards 1. In this embodiment, relatively small heat generating portions 2, that generate a relatively small heating value among groups of chips and package mounted on the printed circuit boards, are supplied with cooling air through nozzles 11 arranged similarly to those according to the second embodiment. On the other hand, a large heating value generating portion 3, that generates a relatively large heating value, is supplied with the cooling air through a nozzle duct 12 formed by partially extending the wall of the chamber further toward the printed circuit boards 1. The nozzle duct 12 is extended to reach the portion in front of the heat radiating fins 4. As a result of the structure thus constituted, the cooling air can be supplied so that a small quantity of the cooling air 8 can be supplied to the small heat generating portions 2 and a large quantity of the cooling air 8 is supplied to the large heat generating portions 3. Therefore, the temperature distribution among the heat generating members 2, 3 can be made uniform. Furthermore, the arrangement, that the nozzle duct 12 is limitedly extended to a position in front of the heat radiating fin 4, enables the height of the heat radiating fin 4 to be made similarly to the height in the conventional case where the cooling air is allowed to flow in parallel to the printed circuit bards 1. Therefore, the enlargement of the frame structure can be prevented. Furthermore, the cooling performance can be improved by a degree corresponding to the increase in the effective cooling air 8.

Figure 20:
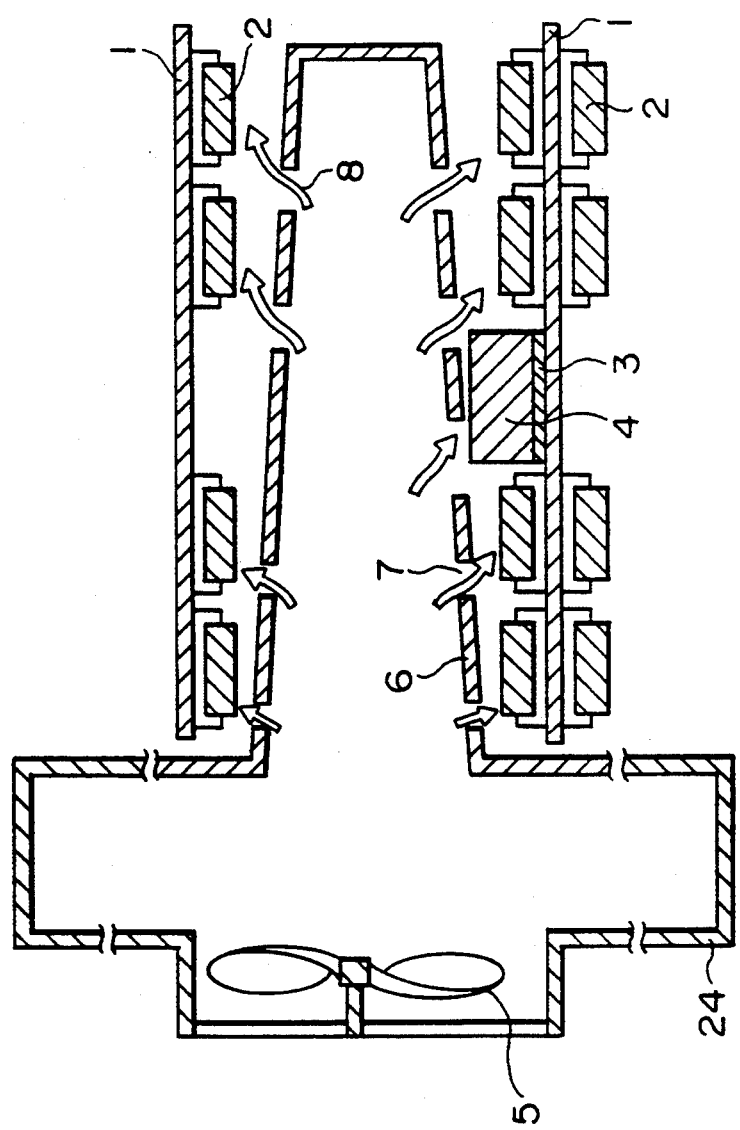
FIG. 20 is a sectional view which illustrates a chamber with a jet stream duct according to a fifth embodiment of the present invention.

FIG. 20 is a partial sectional view which illustrates a chamber having a jetting duct according to a fifth embodiment of the present invention. The embodiment shown in FIG. 20 has an arrangement that the sectional size of a jetting duct 6 is reduced toward downstream of the duct 6. The jetting duct 6, the front (downstream) portion of which is narrowed, has air supply jetting ports 7 at positions corresponding to the positions of the heat generating members 2, 3, the jetting ports 7 being formed in the side wall of the jetting duct 6. As a result, the cooling air 8 can be easily distributed to the heat generating members 2, 3, and inclined flows can be caused to collide with the heat generating members 2, 3. Therefore, the cooling air can be supplied by a quantity corresponding to the heat value of each of the heat generating members 2, 3. Hence, the temperature distribution among the heat generating members 2, 3 can be made uniform. In addition, the fact, that the flowing direction of the cooling air 8 is not changed excessively at the time of passing through the jetting ports 7, enables undesirable pressure loss to be minimized.

Figure 21:
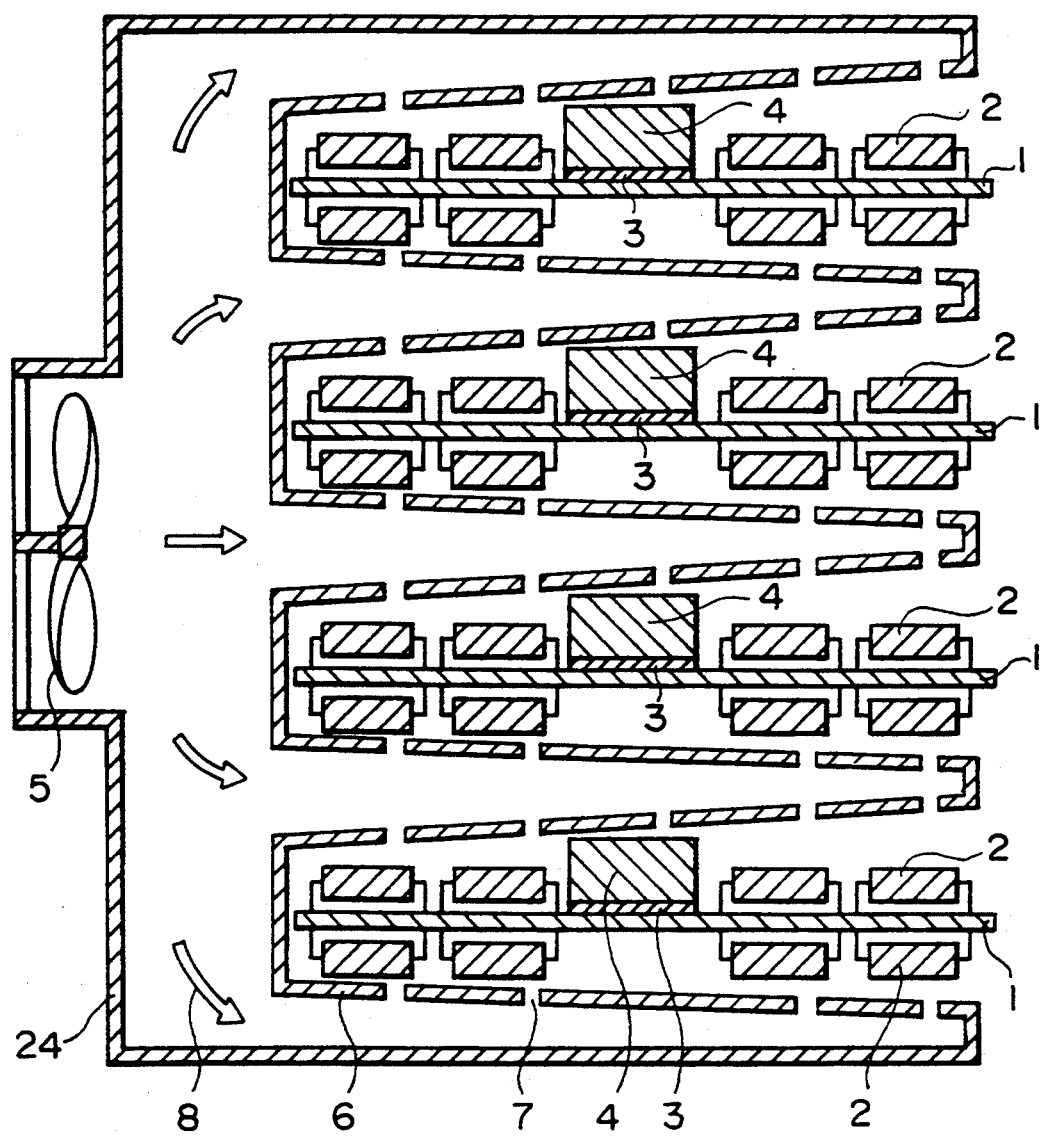
FIG. 21 is a sectional view which illustrates a jet cooling apparatus for electronic equipment according to a fifth embodiment of the present invention.

FIG. 21 is a sectional view which illustrates a case where the jetting duct 6 shown in FIG. 20 is adapted to a computer in which four printed circuit boards 1 are mounted. The jetting ports 7 have different areas to correspond to the heating values of the chips 2, 3 so that the temperature distribution among the heat generating members 2, 3 is made uniform.

Figure 22:
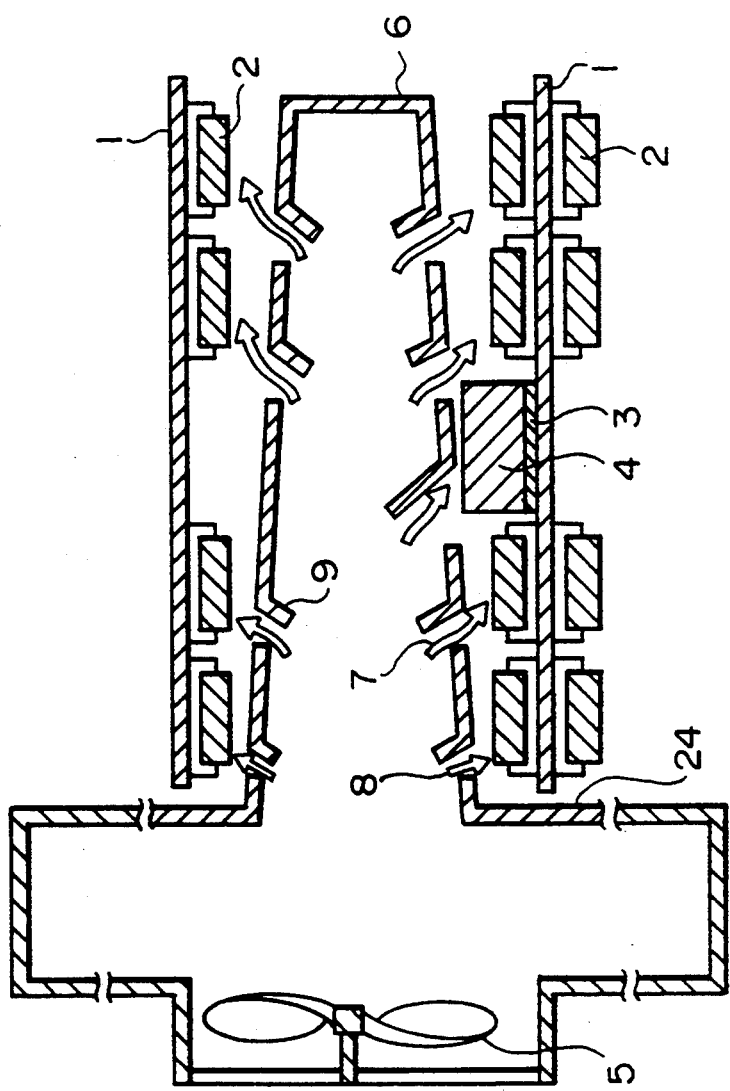
FIG. 22 is a sectional view which illustrates a modification of the chamber with the jet stream duct according to the fifth embodiment of the present invention.

FIG. 22 illustrates a modification of the fifth embodiment of the present invention, this modification being different from the fifth embodiment in that louvers 9 are provided for the jetting ports 7. The louvers 9 are formed by punching out a plate, from which the jetting duct 6 is formed, by using a press or the like. The portion of the louver 9 corresponding to the package 3 generating heat of a large heating value is lengthened to cause a large quantity of the cooling air 8 to flow. By lengthening the portion of the louvers 9 as described above, the cooling air 8 can effectively be used. Therefore, the temperature distribution among the heat generating members 2, 3 can be made uniform. Furthermore, the cooling air 8 is made to be slope or inclined flows, resulting in that the pressure loss can be reduced.

Figure 23A:
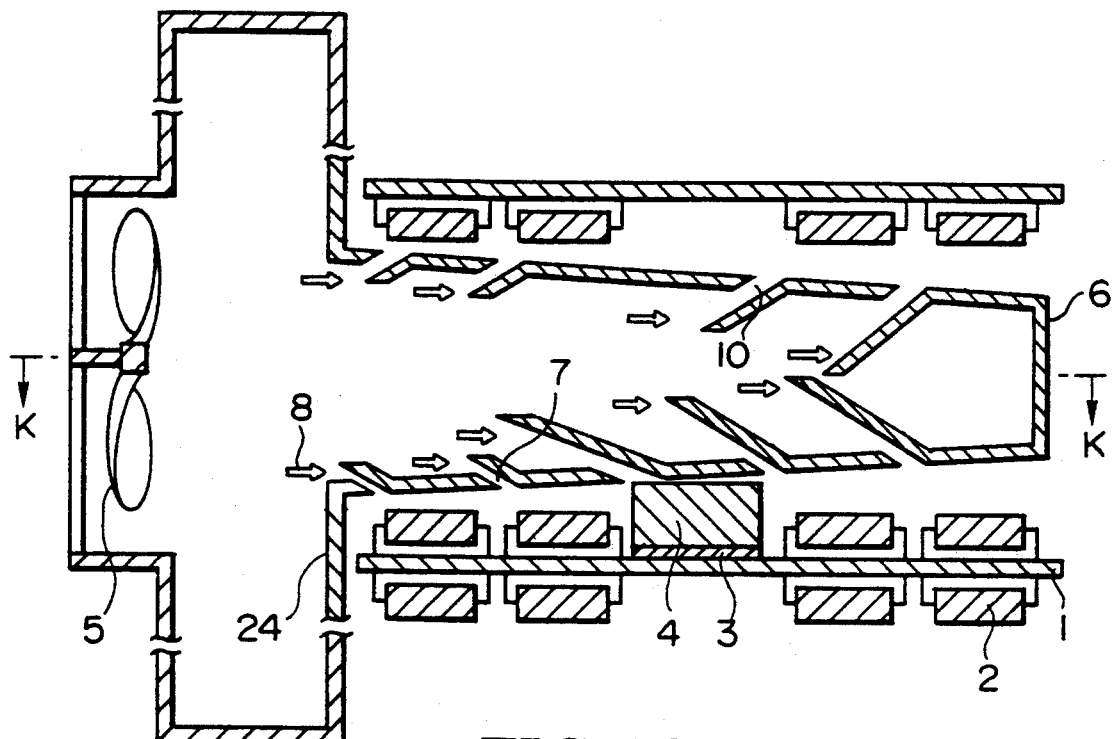
FIGS. 23A and 23B are a sectional views which illustrate a modification of the fifth embodiment of the present invention, FIG. 23B being the section along line K—K of FIG. 23A.
Figure 23B:
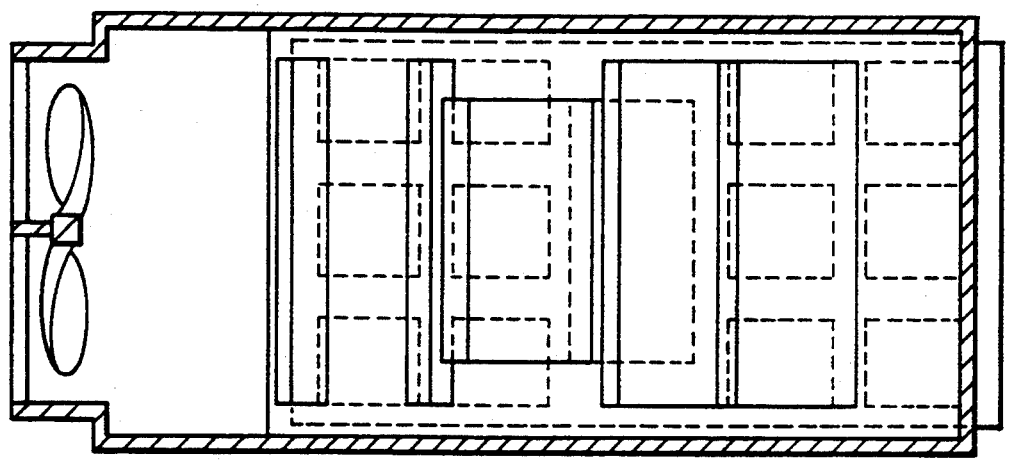

FIGS. 23A and 23B illustrates a modification of the embodiment shown in FIG. 22 having an arrangement that the louvers 9 are lengthened in the direction opposing the direction of the horizontal airflow in the duct 6. In order to lengthen the louvers 9, independent members are bonded or welded to the louvers 9 so that the cooling air 8 adaptable to each heating value is adjusted by the lengths of the louvers 9. As a result, the temperature distribution among the heat generating members 2, 3 can be made uniform and accordingly the cooling performance can be improved. Since also this embodiment has also the arrangement that the cooling air 8 is formed into the slope or inclined flows, the pressure loss can be reduced.

Figure 24:
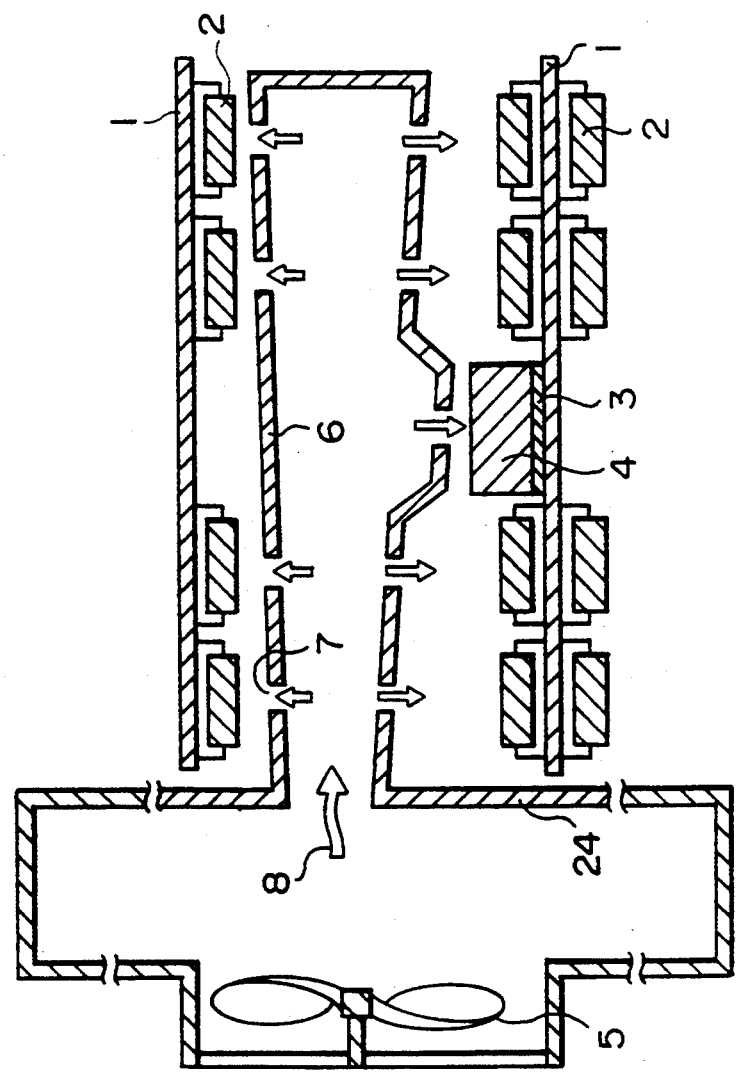
FIG. 24 is a sectional view which illustrates a modification of the chamber with the jet stream duct according to the fifth embodiment of the present invention.

FIG. 24 is a sectional view which illustrates another modification of the fifth embodiment having an arrangement that the distance from the package 3, which generates heat of a large heating value, to the jetting duct 6 is shortened. As a result, a large quantity of the cooling air 8 can be, at high speed, supplied to the intense heat generating member 3. Furthermore, a large quantity of the cooling air 8 is supplied to the downstream heat generating members 2 while considering the temperature rise of the air flow. As a result, the temperature distribution among the heat generating members 2, 3 can be made uniform and accordingly the cooling performance can be improved.

Figure 25:
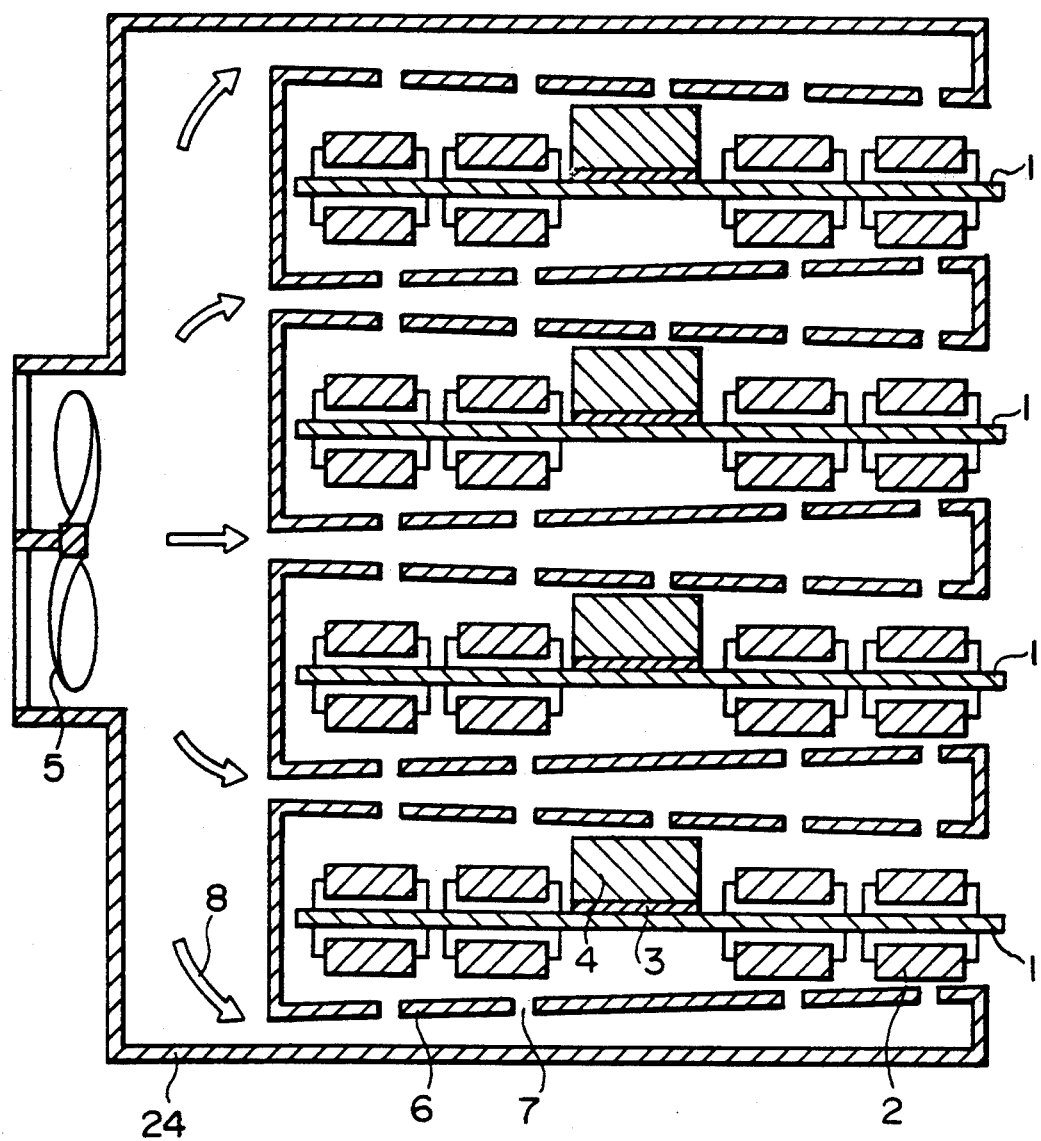
FIG. 25 is a sectional view which illustrates a modification of the fifth embodiment of the present invention.

FIG. 25 illustrates a modification of the embodiment shown in FIG. 24, wherein a computer having four printed circuit boards 1 mounted thereof is illustrated. The distance from the heat generating members 2 to the jetting duct 6 is shortened toward the downstream of the printed circuit boards 1. The reason for this is to compensate of the deterioration in the cooling performance taken place in the downstream of the printed circuit boards 1 due to a rise of the temperature of the air. As a result, the temperature distribution among the heat generating members 2, 3 can be made uniform.

Figure 26A:
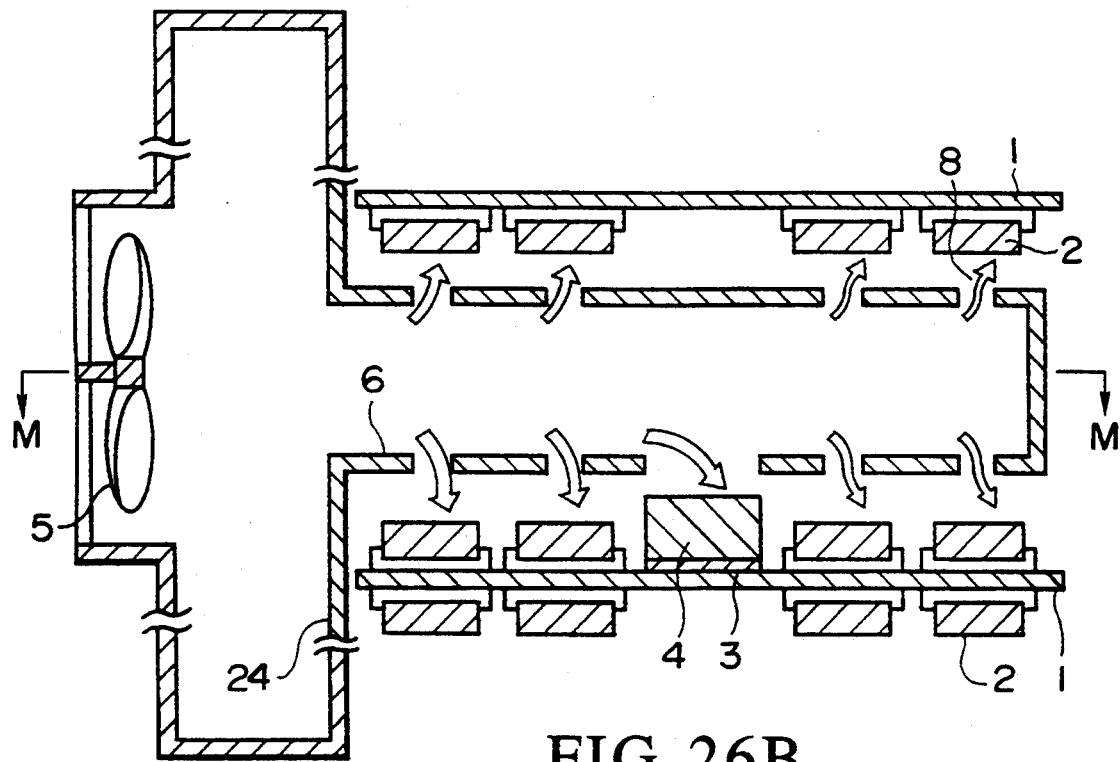
FIGS. 26A and 26B ere sectional views which illustrate a modification of the fifth embodiment of the present invention.
Figure 26B:
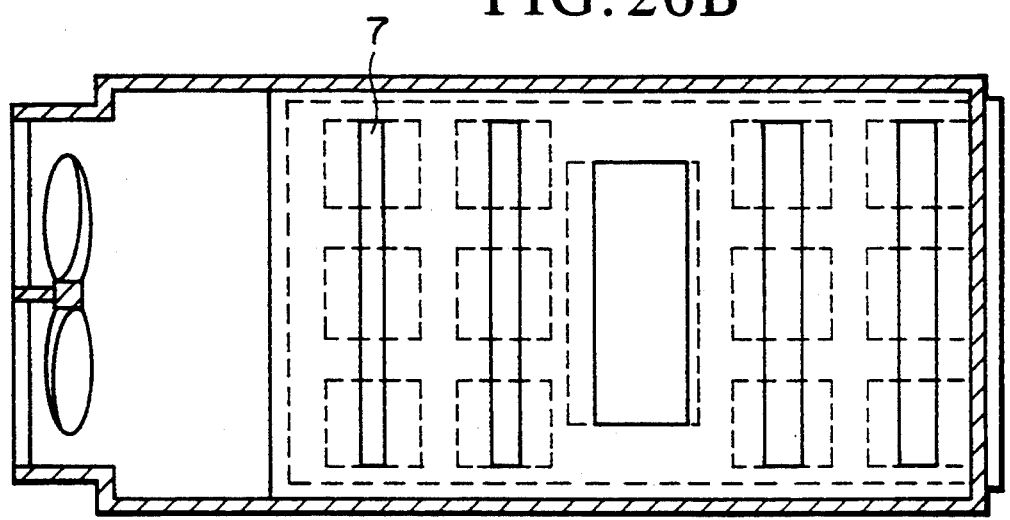

FIGS. 26A and 26B illustrate a jetting duct 6 according to still another modification of the fifth embodiment of the present invention.

The jetting duct 6 is disposed in a space between the printed circuit boards 1, the jetting duct 6 having rectangular jetting ports 7 therein. Each of the jetting ports 7 has a width substantially the same as that of each group of the IC chips 2. As a result, several IC chips 2 can be cooled by the cooling air 8 supplied through one jetting port 7. The rectangular jetting ports 7 have different widths at each position in the direction of the flow of the cooling air through the IC chips 2 considering the heating value of the corresponding groups of the IC chips 2 and the temperature rise of the cooling air. Furthermore, the structure is arranged so that the cooling air 8 from the fan 5 can be directed to each of the heat generating members 2, 3. Since the structure has an arrangement that each jetting port 7 is able to cool the plural chips 2, 3, clogging of the jetting port taken place due to dust or the like mixed in the environmental air sucked by the fan 5 can be prevented. Furthermore, the arrangement that each of the jetting ports 7 is formed into the rectangular shape enables the number of the jetting ports to be decreased as compared with the structure in which the jetting ports 7 are formed to correspond to the heat generating members. Therefore, an effect of a cost reduction can be obtained.

Figure 27B:
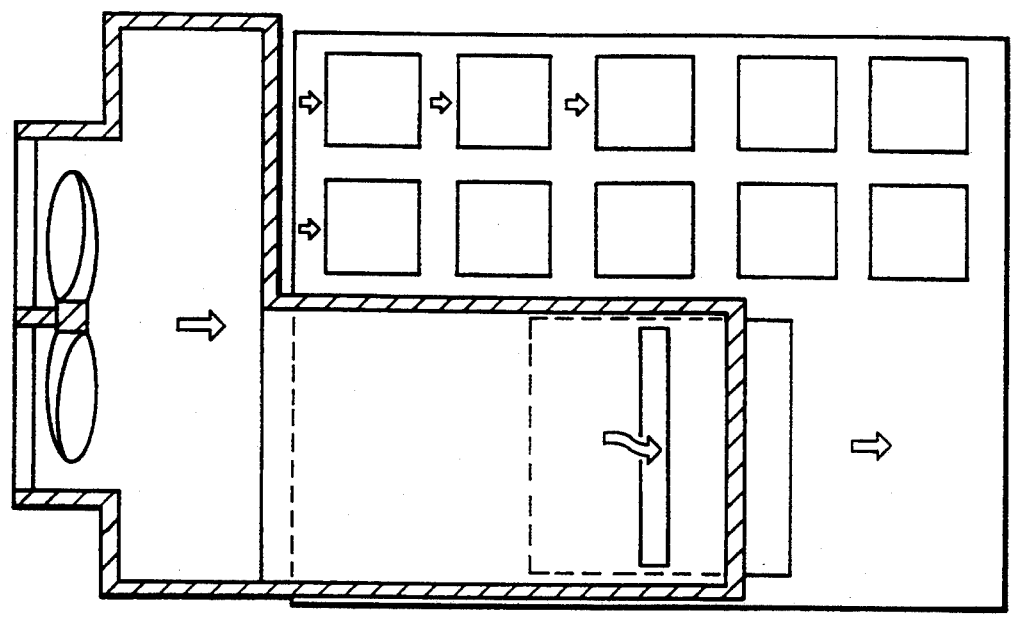
FIGS. 27A and 27B are sectional views which illustrate a modification of the fifth embodiment of the present invention, FIG. 27B being the section along line N—N of FIG. 27A.
Figure 27A:
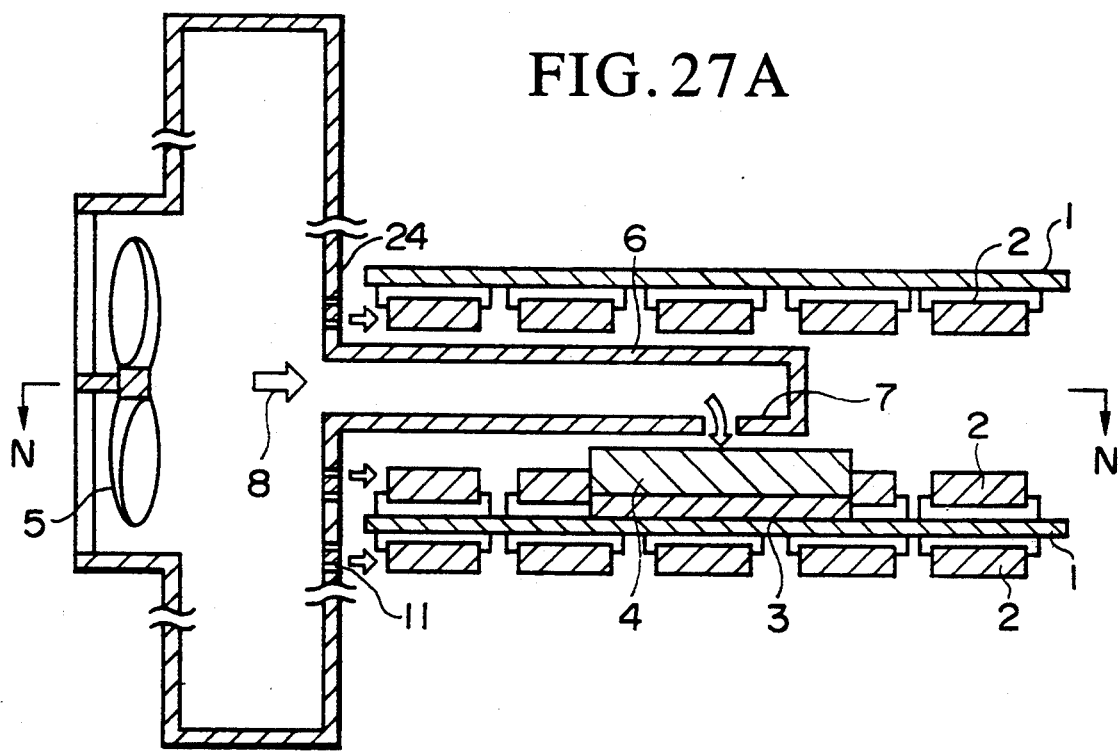

FIGS. 27A and 27B illustrate a still another modification of the fifth embodiment of the present invention. This embodiment has an arrangement similar to the embodiment shown in FIG. 19 that the small or low heat generating members 2 are supplied with the cooling air 8 through the nozzles 11 and the intense heat generating member 3 is supplied with the same through the jetting duct 6. As a result, the cooling air 8 can be supplied to the heat generating members 2, 3 to correspond to the heating values. Therefore, the temperatures of the heat generating members 2, 3 can be made uniform.

Figure 28:
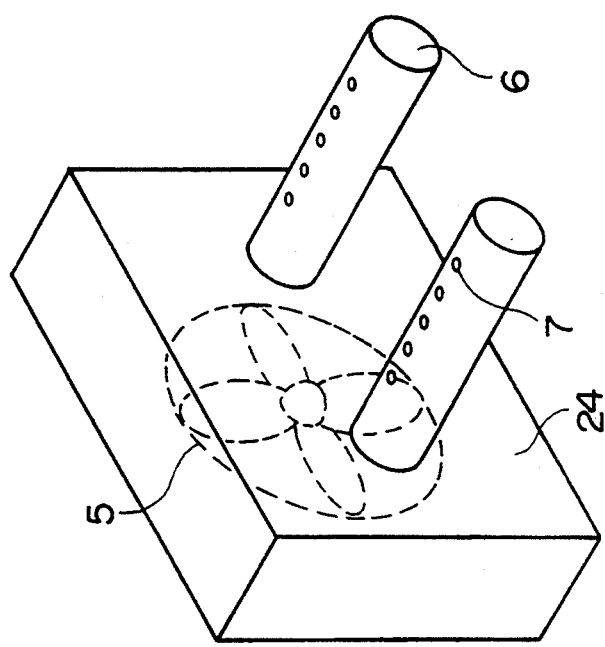
FIG. 28 is a perspective view which illustrates a chamber with a jet stream duct according to a sixth embodiment of the present invention.

FIG. 28 illustrates a sixth embodiment of the present invention and has an arrangement that the duct portion of each of the jetting ducts 6 is formed into a curved shape. Although the shape of the jetting port 7 in the duct portion is formed into a circular shape in the embodiment shown in FIG. 28, it may be formed into a rectangular shape or an elliptic shape. The shape of the jetting port 7 may be varied for each package 3 or the chip 2. The shape can be formed to be adaptable to the heating value as described above and accordingly the temperature distribution among the heat generating members 2, 3 can be made uniform. Furthermore, the arrangement that the jetting duct 6 is formed into the curved shape enables the cooling air to be discharged along the curved surface. As a result, a pressure loss taken place in the exhaust process can be reduced.

Figure 29A:
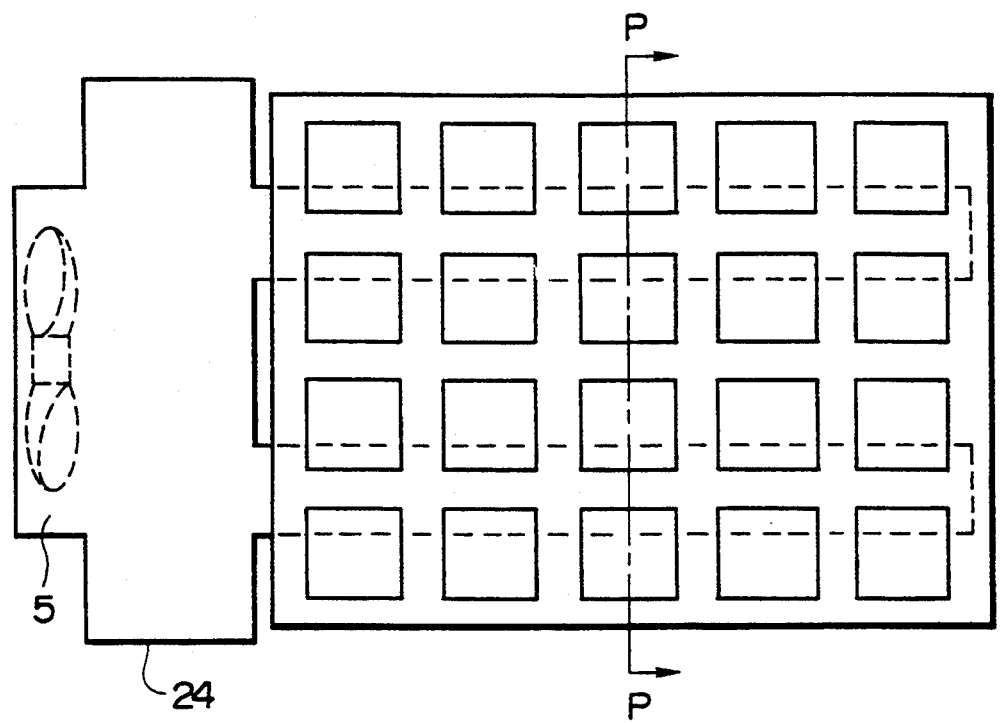
FIGS. 29A and 29B are a top view of FIG. 28 where the ducts of FIG. 28 are disposed between printed circuit boards and a sectional view (along line P—P) of FIG. 29A.
Figure 29B:
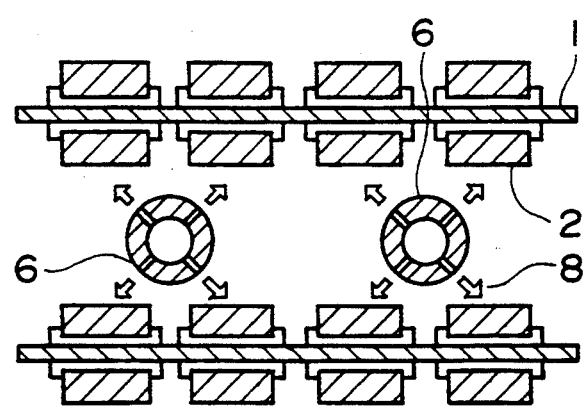

FIGS. 29A and 29B illustrates a state where the jetting ducts 6 are disposed between the printed circuit boards 1. Since the cooling air 8 having collided with the IC chips 2 is able to pass through the passages formed between the printed circuit boards 1 along the curved surfaces of the jetting ducts 6, the influence of the temperature rise of the cooling air adjacent to the heat generating members 2, 3 can be substantially reduced. Therefore, the cooling performance can be improved and the pressure loss can be reduced.

Figure 30:
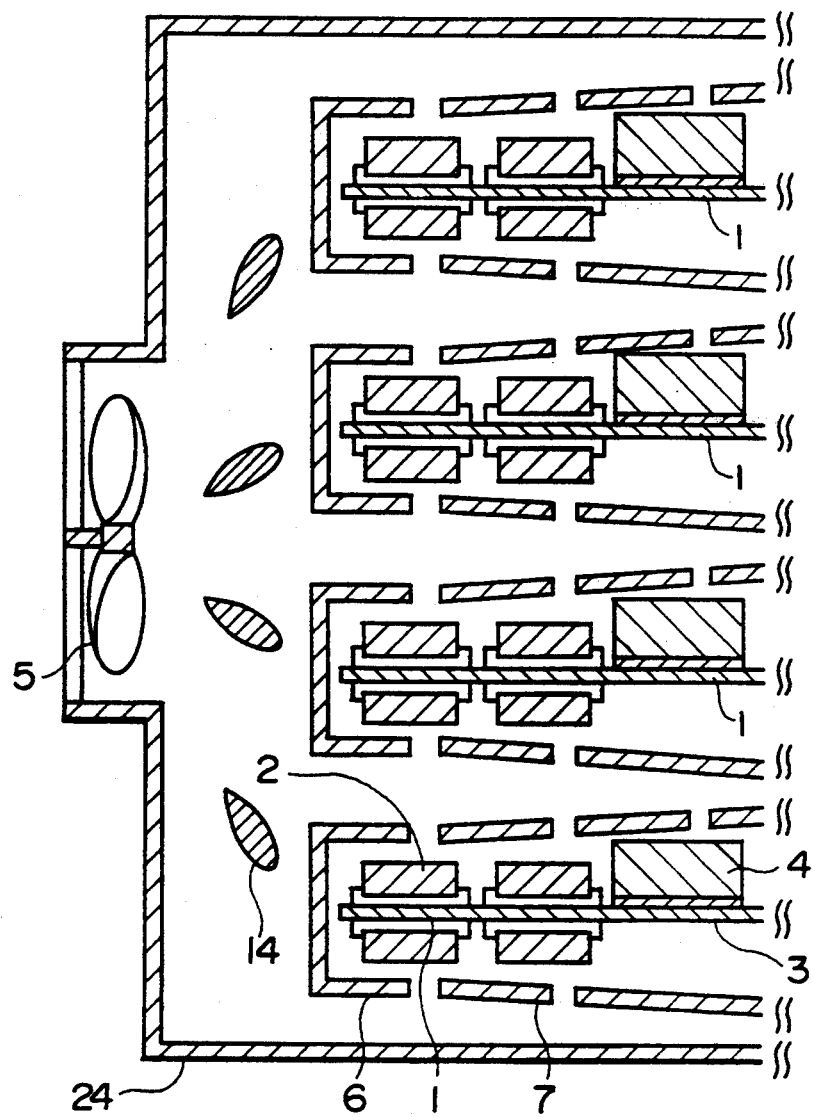
FIG. 30 is a sectional view which illustrates a chamber with jet stream ducts according to a seventh embodiment of the present invention.

FIG. 30 illustrates a seventh embodiment of the present invention having an arrangement that the same quantity of air is supplied to each of the printed circuit boards 1. The chamber 24 incorporates wing-type guide plates 14. If the fan 5 is rotated in a state where the guide plates 14 are omitted, a swirling flow cannot be easily generated adjacent to the central portion of the fan 5 and accordingly only a small quantity of airflow is generated. It leads to a fact that the quantity and the velocity of the airflow do not become uniform in the chamber 24. However, the provision of the guide plates 14 enables the cooling air 8 to be uniformly distributed to the space among the printed circuit boards 1. Furthermore, the pressure loss can be minimized and therefore the temperature distribution among the heat generating members 2, 3 on the printed circuit boards 1 can be made uniform.

Figure 31:
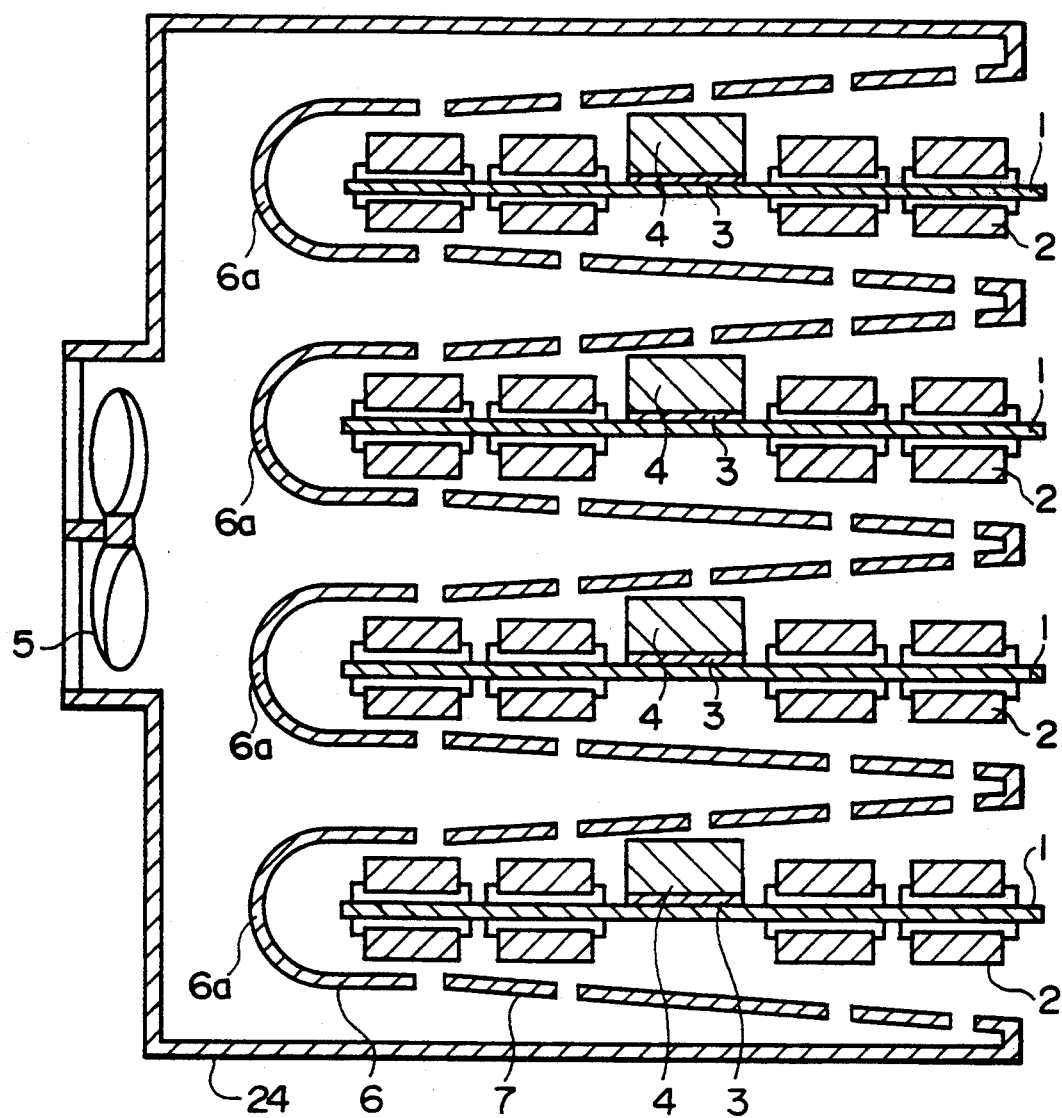
FIG. 31 is a sectional view which illustrates a modification of the seventh embodiment of the present invention.

FIG. 31 illustrates a case where the branching portions 6a of the jetting ducts 6 are formed into curved shapes. By forming the branching portions 6a into the curved shapes, separations of air flow from surfaces of the branching portions 6a can be reduced and therefore the pressure loss can be considerably reduced. Furthermore, the flow quantity can be uniformly distributed to the spaces among the printed circuit boards 1 by adjusting the sizes of the curved portions 6a. As a result, the temperature distribution among the heat generating members 2, 3 on the printed circuit boards 1 can be made uniform.

Figure 32:
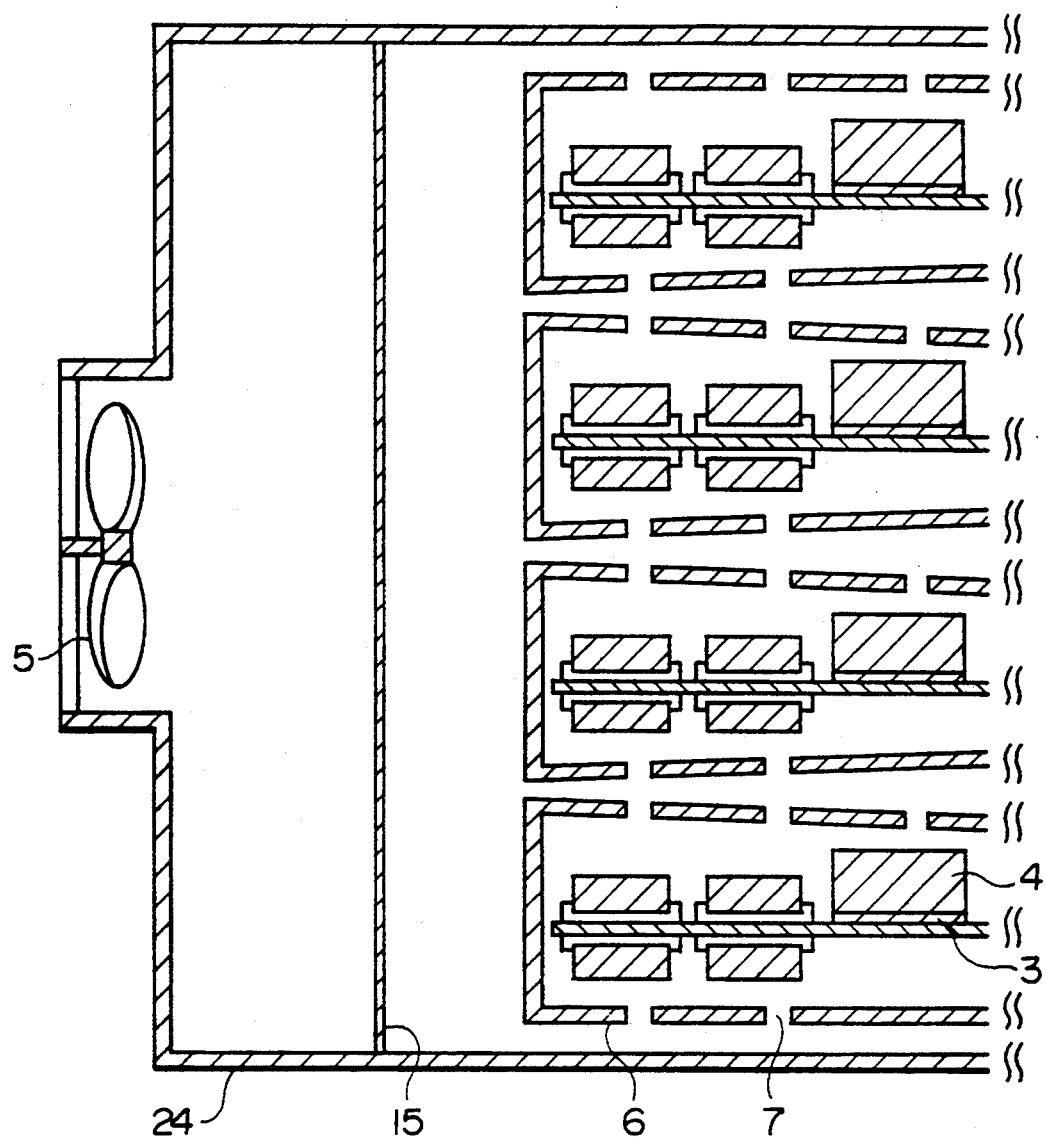
FIG. 32 is a sectional view which illustrates a modification of the seventh embodiment of the present invention.

FIG. 32 illustrates an example in which a flow rectifying wire net 15 is disposed between the fan 5 and the branching portions. By providing the flow rectifying wire net 15, the pressure in the chamber 24 can be made uniform and therefore the flow quantity or the like can be distributed as desired. Furthermore, the temperature distribution among the heat generating members 2, 3 can be made uniform. In addition, the flow rectifying wire net 15 removes foreign matters such as dust, causing the reliability to be improved because the cooling air 8 including no foreign matter can be supplied to the heat generating members 2, 3.

FIGS. 33, 34, 35A and 35B illustrate modifications of the body of the chamber

Figure 33:
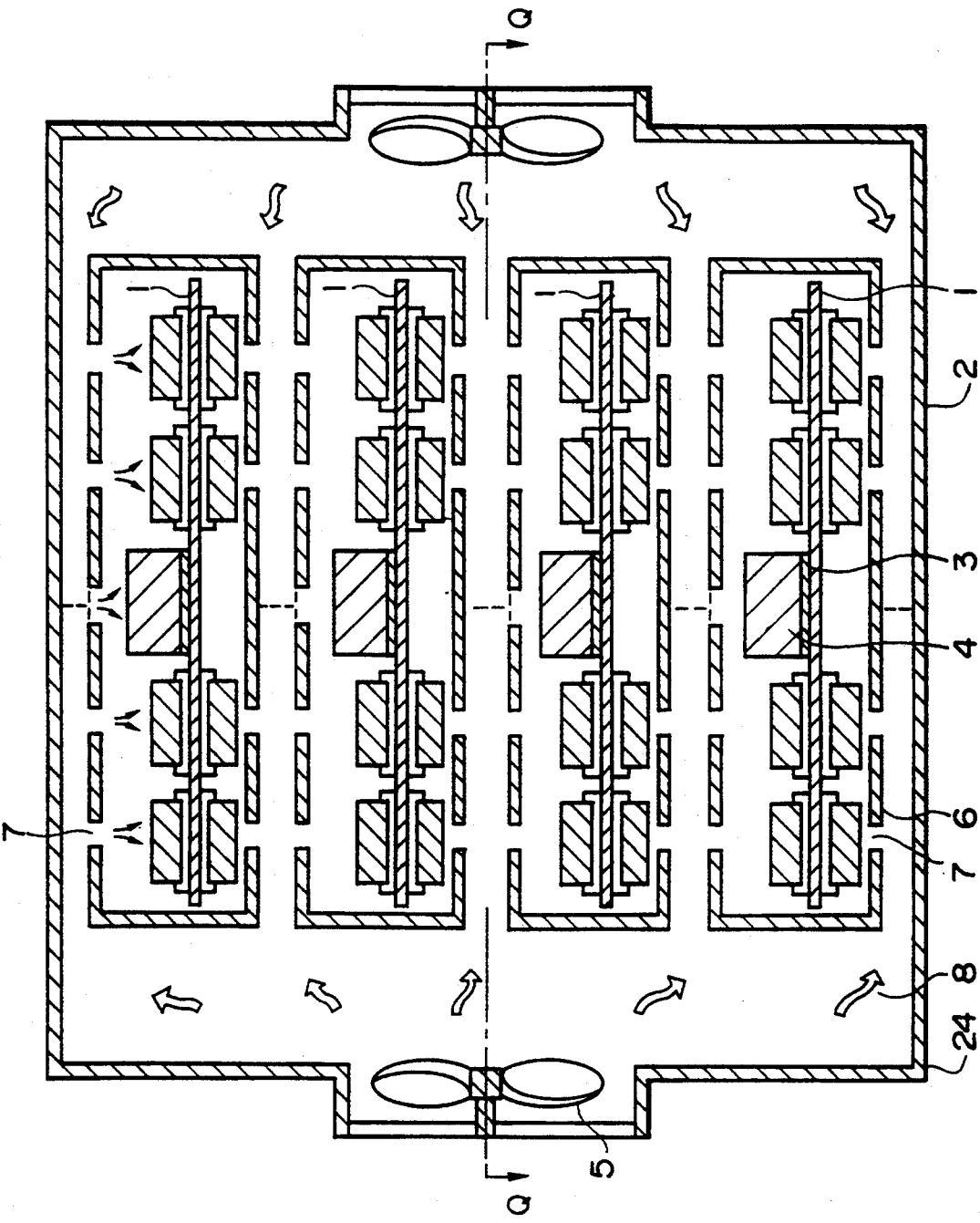
FIG. 33 is a sectional view which illustrates a jet cooling apparatus for electronic equipment according to an eighth embodiment of the present invention.

FIG. 33 illustrates an eighth embodiment of the present invention having an arrangement that a group of printed circuit boards 1 are accommodated in the chamber 24 and the jetting duct portions 6 are formed among the printed circuit boards 1. In this embodiment, the cooling air 8 is supplied from the two sides to make uniform the pressure distribution in the duct 6. As a result, the cooling air 8 flowed out through the jetting ports 7 can be distributed by the same quantities to the printed circuit boards 1. Therefore, the temperature distribution among the heat generating members 2, 3 can be made uniform.

Figure 34:
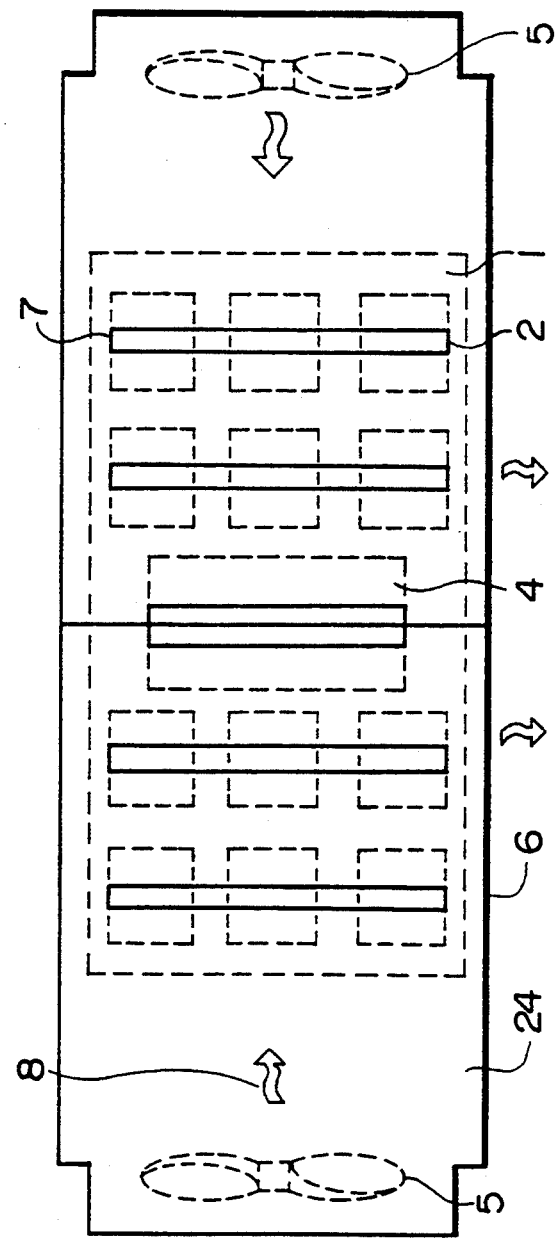
FIG. 34 is a sectional view taken along line Q—Q of FIG. 33.

FIG. 34 is a cross sectional view which illustrates the jetting ducts shown in FIG. 33 and taken along line Q—Q of FIG. 33. The jetting ports 7 are formed into rectangular shapes similarly to the embodiment shown in FIG. 26B. Since two fans 5 are provided, the cooling air 8 can be supplied from the two sides. As a result, the pressure distribution in the duct 6 can be made uniform, the cooling air 8 flowed out through the jetting ports 7 can be supplied by the same quantities to the printed circuit boards 1, and accordingly the temperature distribution among the heat generating members 2, 3 can be made uniform. Although the two fans 5 are provided in this embodiment, three or more fans may, of course, be provided to correspond to the heating value, when desired.

Figure 35A:
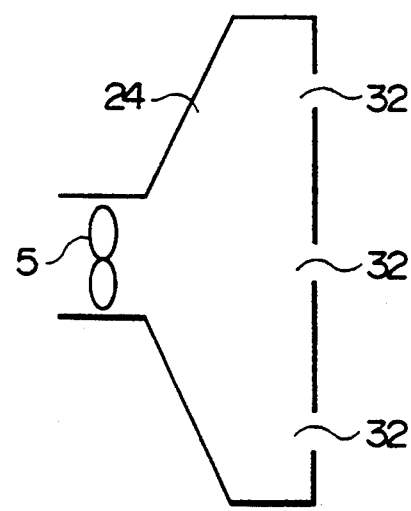
FIGS. 35A and 35B are sectional views which illustrate modifications of the body of a chamber of a jet cooling apparatus for cooling electronic equipment according to the present invention.
Figure 35B:
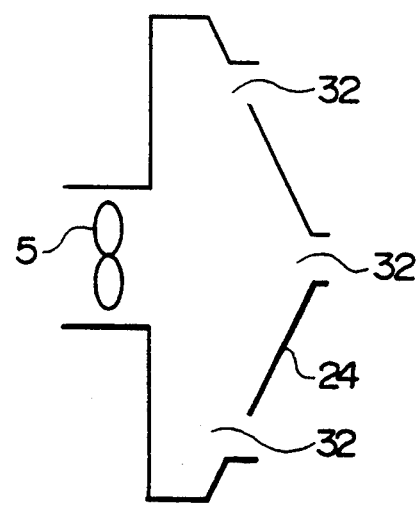

Another modification of the body of the chamber 24 is shown in FIGS. 35A and 35B.

FIG. 35A illustrates an arrangement of this modification in which the shape of the rear wall (the left wall of FIG. 35A) of the two walls of the chamber 24, to which the axial flow fan 5 is fastened, is formed into a funnel-like shape to enlarge the thickness of the duct 24 in the central portion of the chamber 24. Instead of this, an arrangement in which the front wall of the chamber 24 is projected forwards is shown in FIG. 35B. In these embodiments, the ribs 31 are not provided in the chamber 24 and three slits 32 are formed in the front wall of the chamber 24. However, ribs may be formed in the chamber 24 in parallel to the direction in which the slits 32 are formed. Moreover, the number of the slits 32 may be increased. In any one of the aforesaid cases, the cooling airflow can be equally distributed similarly to the foregoing embodiments.

Figure 36:
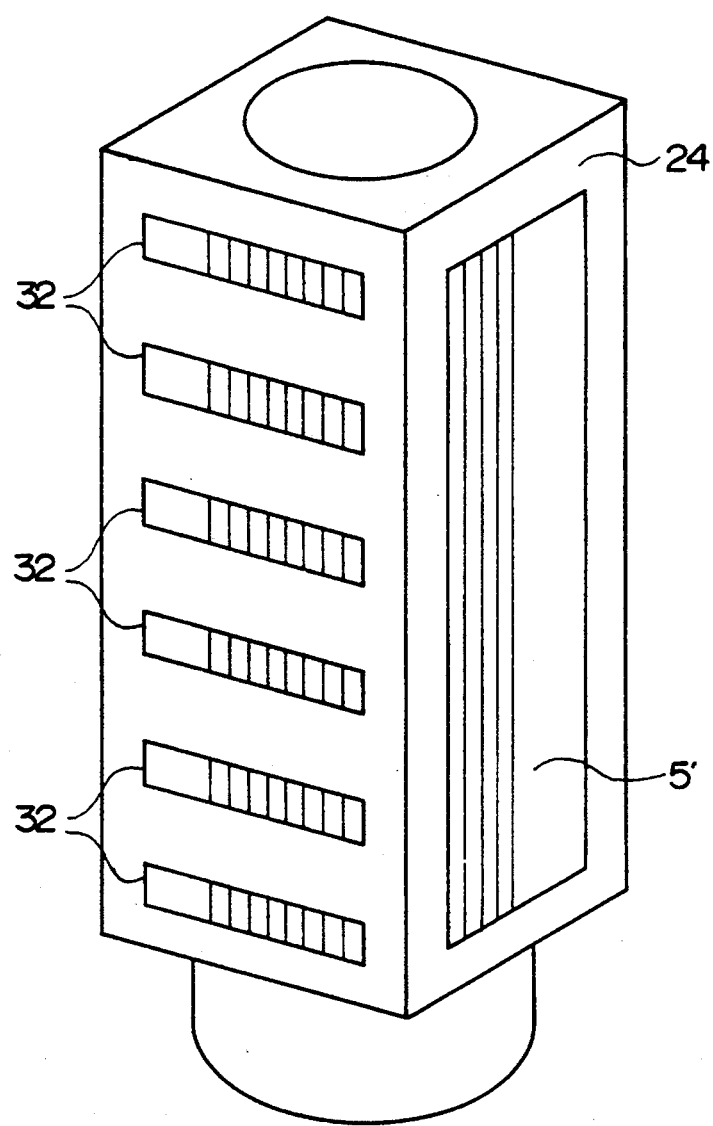
FIG. 36 is a perspective view which illustrates a ninth embodiment in which a once-through fan is employed in the jet cooling apparatus for electronic equipment according to the present invention.

Although each of the foregoing embodiments employs the so-called axial flow fan as the fan 5 for supplying cooling air to the aforesaid chamber 24, the present invention is not limited to this. For example, a so-called once-through fan may be employed as the fan 5 as illustrated in FIG. 36 and ensuing drawings. In the embodiment shown in FIG. 36, the casing for the once-through fan 5' and the casing for the chamber 24 are integrally formed. Furthermore, slits 32 are formed in air discharge portions of the once-through fan 5'. This embodiment, which employs the once-through fan 5', enables an effect to be obtained in that the air quantity distribution among the plural slits 32 formed in the front surface of the chamber 24 can be made more uniform as compared with the foregoing case where the axial flow fan 5 is used.

Figure 37:
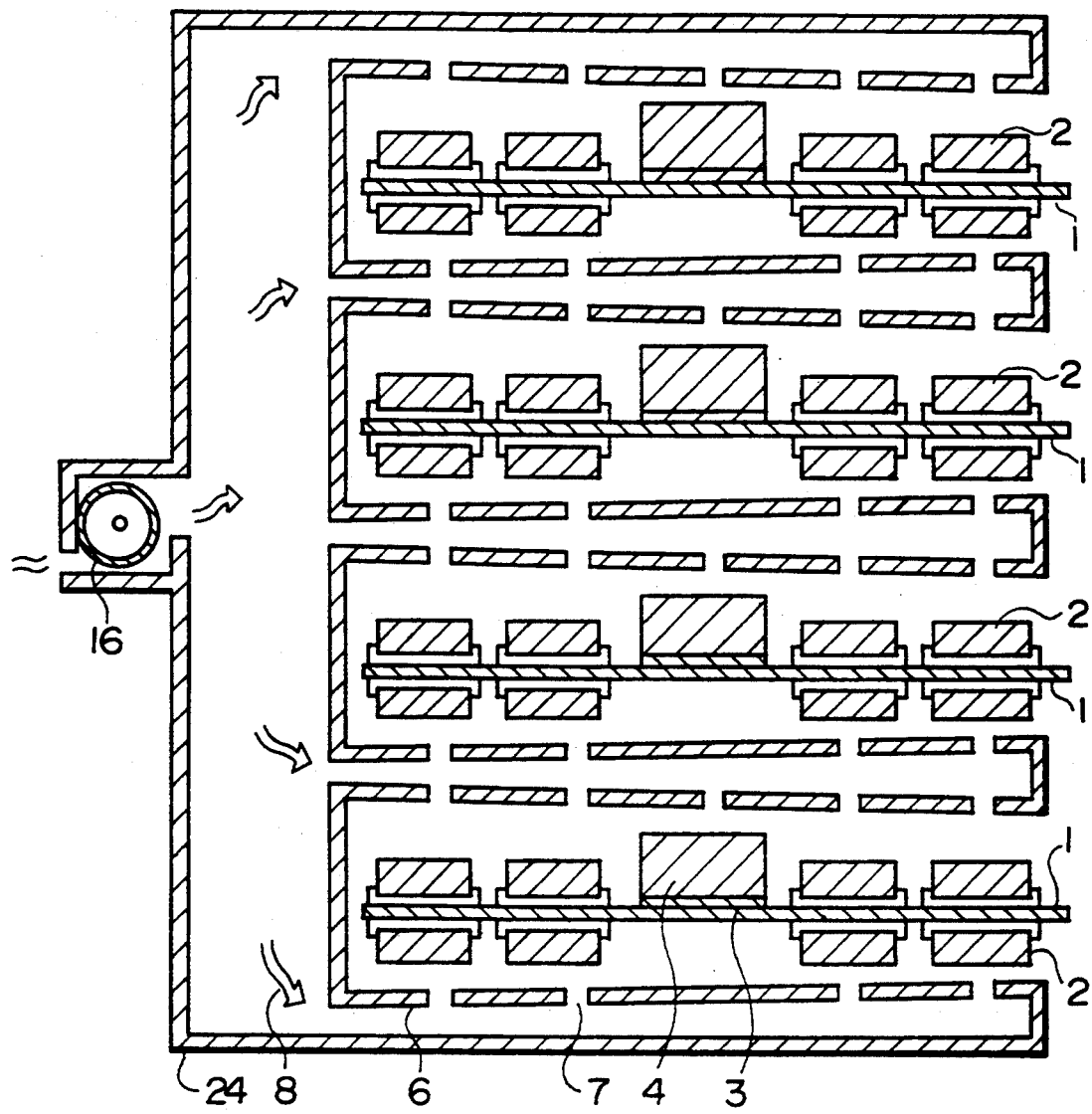
FIG. 37 is a sectional view which illustrates a modification of the ninth embodiment of the present invention.

FIG. 37 illustrates an example having an arrangement that the axis of the once-through fan 16 is made coincide with the widthwise direction of the printed circuit board 1.

Figure 38:
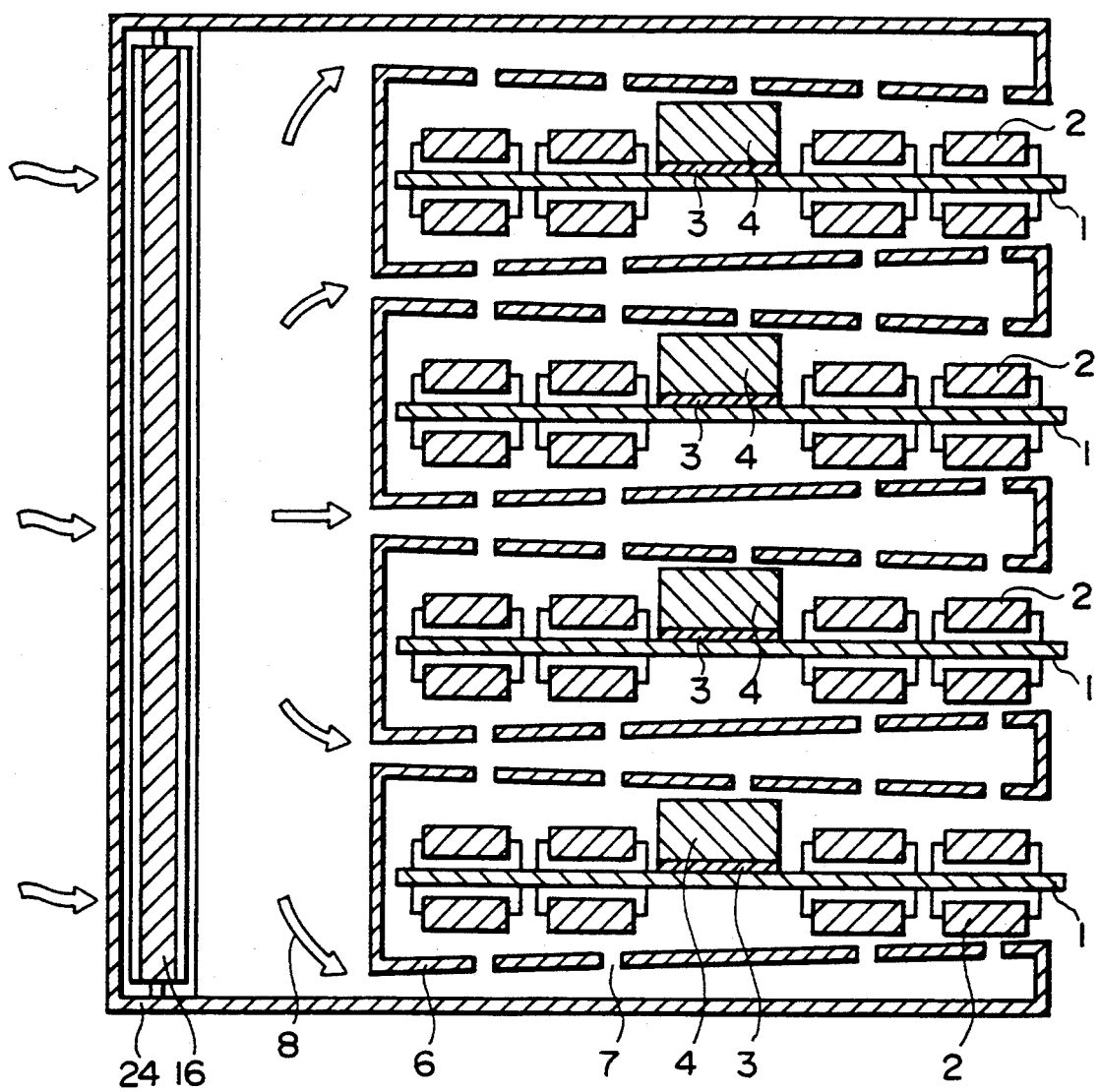
FIG. 38 is a sectional view which illustrates a modification of the ninth embodiment of the present invention.

FIG. 38 illustrates an example having an arrangement that the axis of the once-through fan 16 is made coincide with the direction in which the printed circuit boards 1 are stacked.

In the case shown in FIG. 37, the cooling air can be made uniform in the widthwise direction of the printed circuit boards 1.

The arrangement shown in FIG. 38 is effective in the case where a large number of the printed circuit boards 1 are fastened, resulting in that the same flow quantity can be distributed to each printed circuit board 1. Thus, the temperature distribution among the heat generating members 2, 3 can be made uniform. Also in this case, a plurality of once-through fans 16 may be provided in the widthwise direction of the printed circuit boards 1 (in the vertical direction of the drawing) to make uniform the quantity of the cooling air to be supplied to the surfaces of the printed circuit boards 1.

Figure 39:
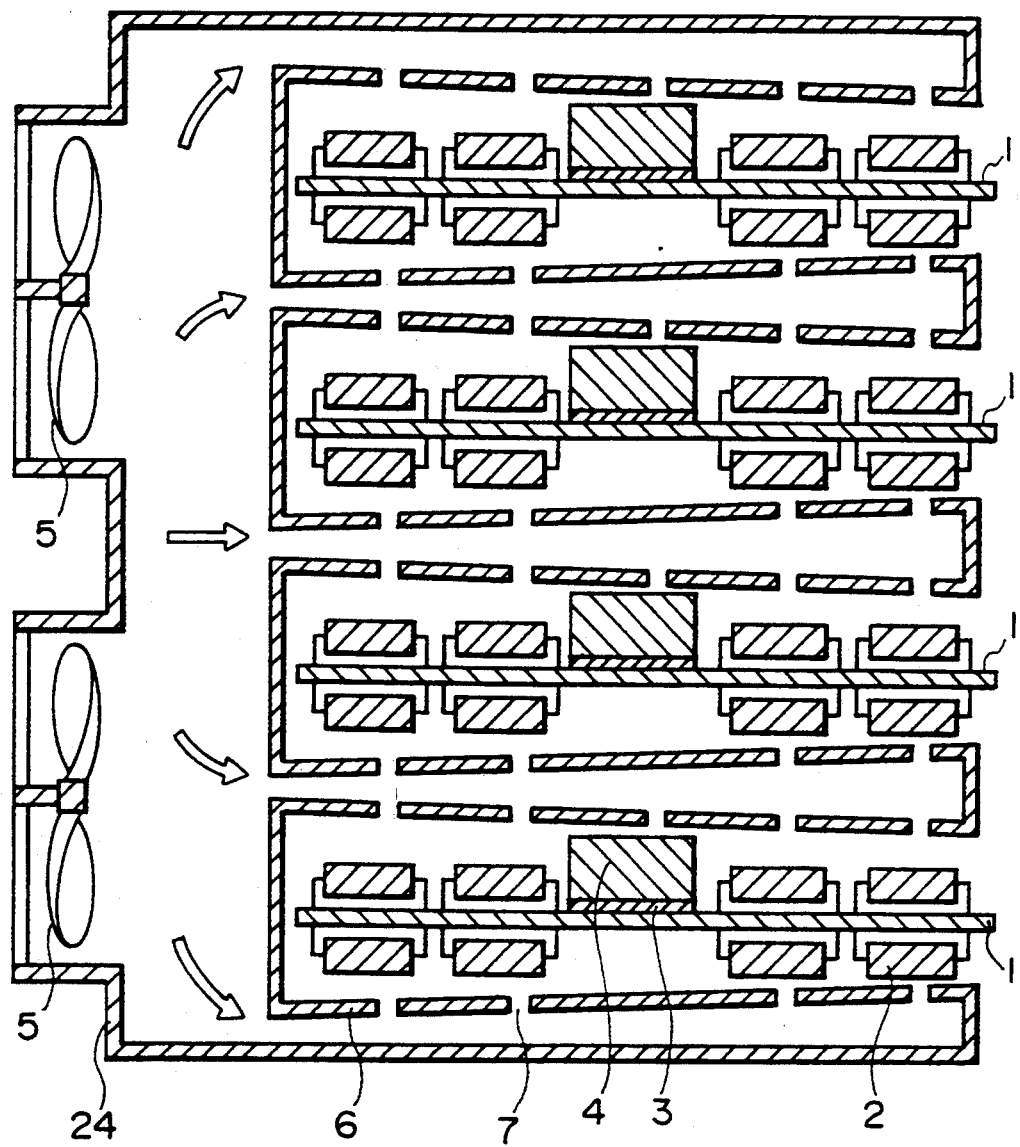
FIG. 39 is a sectional view which illustrates a modification of the fifth embodiment of the present invention.

FIG. 39 illustrates a case where a plurality of the fans 5 are mounted. By mounting a plurality of the fans 5, the total air quantity can be enlarged and the static pressure can be raised. Therefore, this embodiment can be adapted to a passage, in which a great pressure loss takes place, and is effective in the case where a large number of the printed circuit boards 1 are mounted.

Figure 40A:
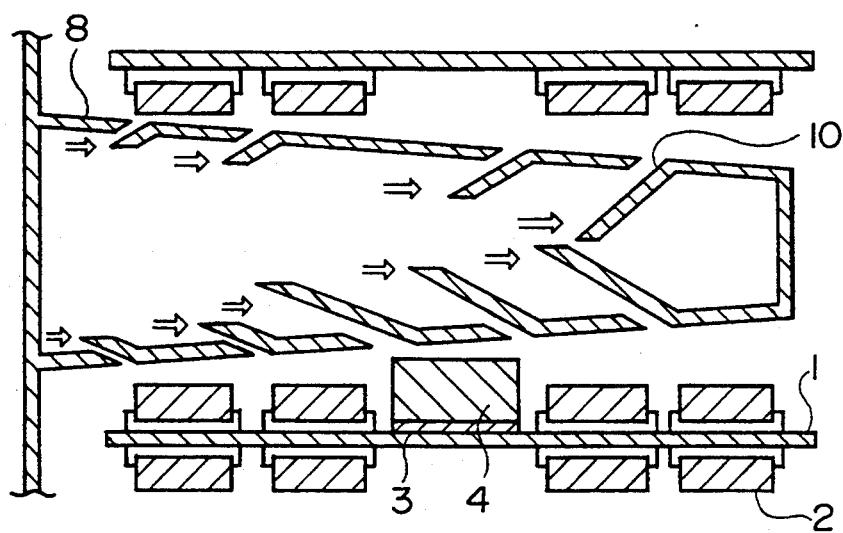
FIGS. 40A and 40B illustrate a modification of the fifth embodiment of the present invention where
Figure 40B:
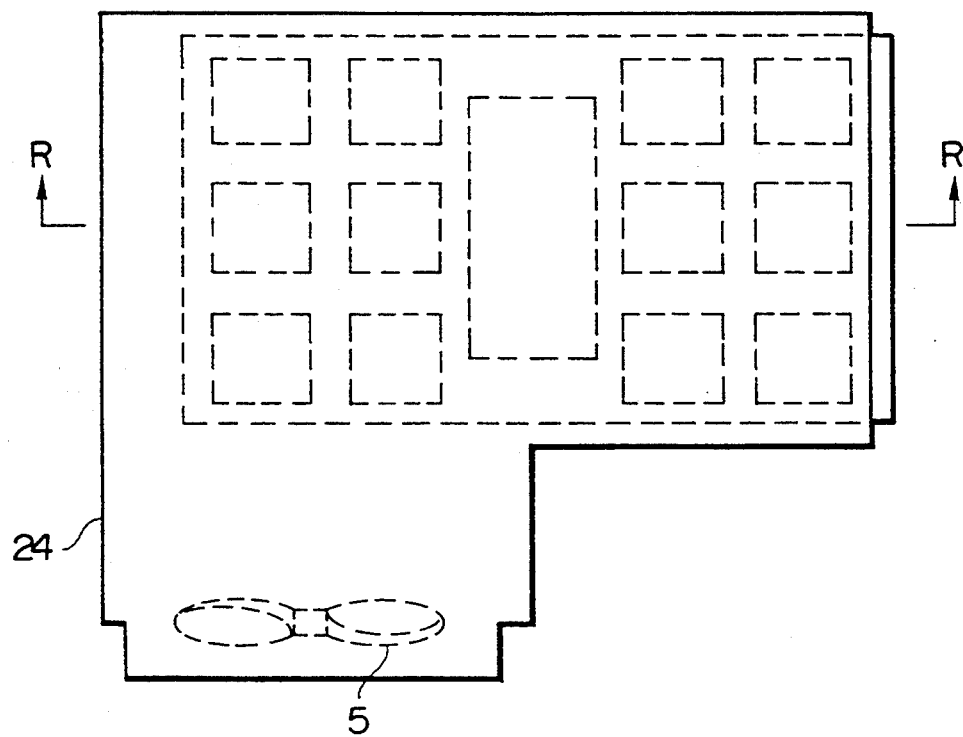

FIGS. 40A and 40B illustrate a case where the direction of the fan 5 shown in FIG. 23 is changed by 90°. If a sufficiently large space cannot be used to dispose the fan 5 in the lengthwise direction of a group of printed circuit boards 1 in a case of disposing the printed circuit boards 1 having the jetting duct 6 in the frame, this arrangement is satisfactory or effective and the required space can be reduced.

Figure 41:
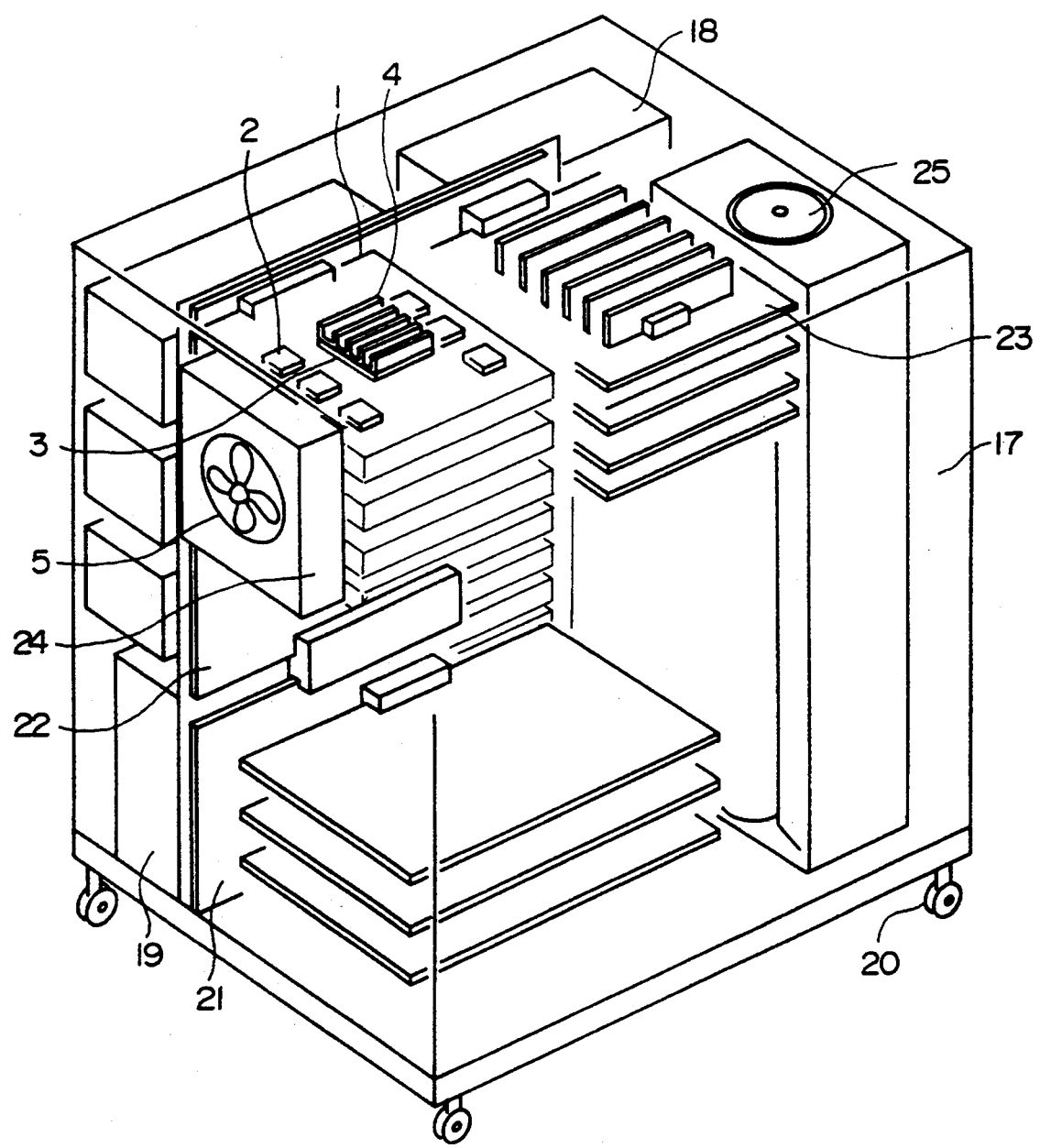
FIG. 41 illustrates a computer, on which the jet cooling apparatus for electronic equipment, according an embodiment of the present invention is mounted.

FIG. 41 illustrates a case where the jetting duct 6 is disposed in a frame 17. The frame 17 is moveably carried by means of casters 20. In the frame 17, the following elements are mounted: the chamber 24; the once-through fan 25 serving as the main fan; a hard disk 18; a power source 19; an I/O board 21 which is an optional board; a CPU board 22 having the printed circuit boards 1 on which the IC chips 2 for use as memories and the package 3 constituting the CPU (central processing unit) are mounted; and a memory board 23. The maintenance of the printed circuit board 1 is performed in the following manner. When a side plate of the frame 17 is removed, the chamber 24 is removed together with the side plate of the frame 17. Thus, the conventional maintenability is not affected.

Figure 42:
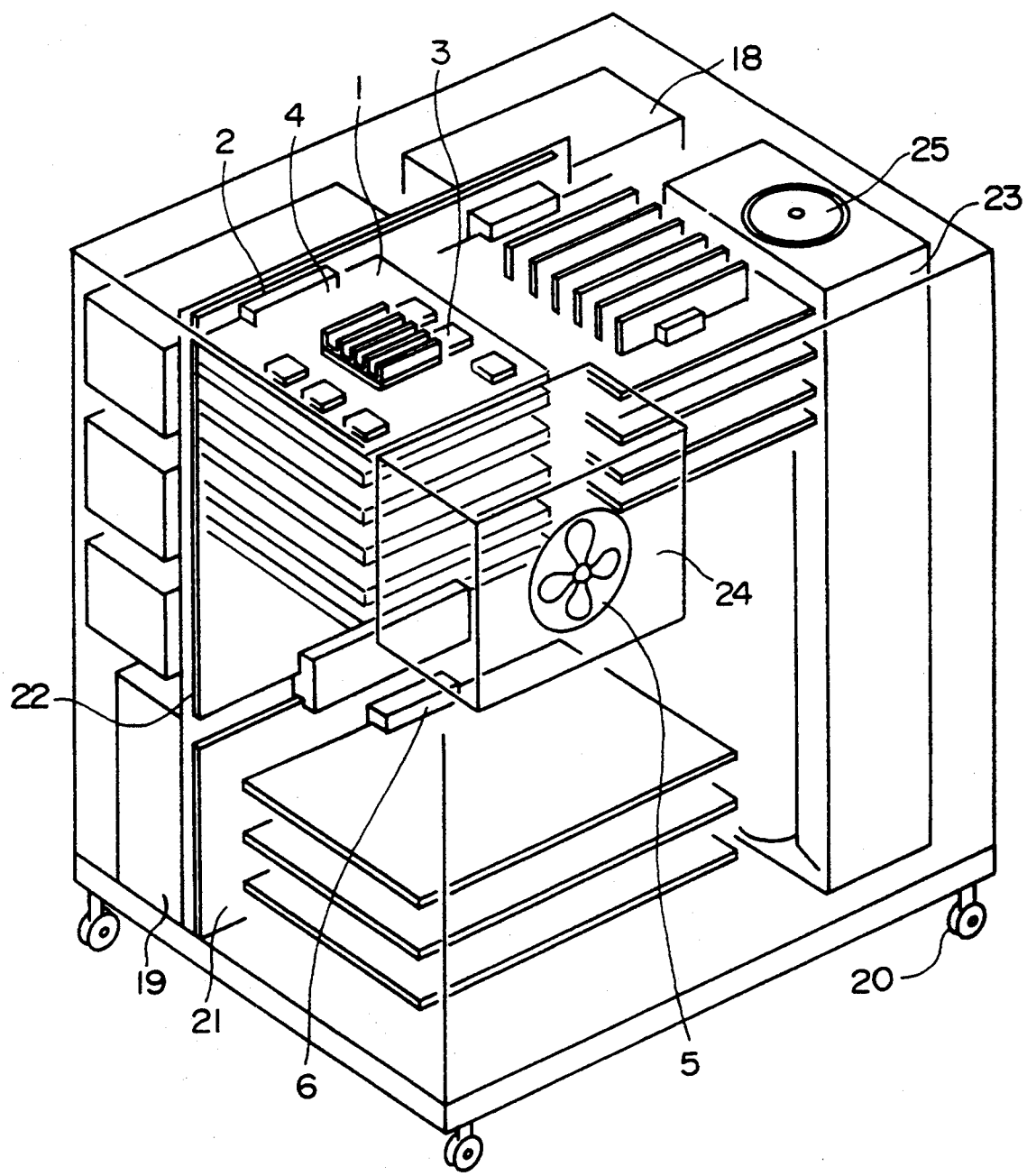
FIG. 42 illustrates a computer, on which the jet cooling apparatus for electronic equipment, according another embodiment of the present invention is mounted.

In an example shown in FIG. 42, printed circuit boards 1, a fan 5 and a power source 19 and so forth similar to those according to the example shown in FIG. 41 are included in the frame 17. The chamber 24 is different from that according to the example shown in FIG. 41 in that it is mounted at an orientation rotated by 90° with respect to the printed circuit boards 1. This arrangement is effective when the space must be reduced. Since the arrangement is so made that the maintenance of the printed circuit board 1 is performed by removing the side plate of the frame 17 to remove the chamber 24 together with the side plate, the conventional maintenability is not affected either.

As described above, since the invention employs the arrangement that the arbitrarily formed (as desired) nozzles are provided for the cooling air supply chamber separately from the heat generating printed circuit boards, the required space among the printed circuit boards can be reduced and the conventional workability at the time of performing the maintenance operation is not affected. Furthermore, since a high speed flow can be supplied to the heat generating portions, the temperature distribution among the heat generating portions can be made uniform and accordingly the cooling performance can be improved.

Since the present invention enables the jet streams of cooling air exhibiting a substantially uniform speed distribution to be desirably controlled while forming the jet streams into slit shapes and corresponding to the heating value or the like of the electronic printed circuit boards (boards) to be cooled, an excellent cooling efficiency can be obtained while necessitating a reduced quantity of the airflow. As a result, a compact cooling apparatus can be realized. Consequently, significantly excellent effects can be exhibited in that space reduction can be realized easily while eliminating a necessity of changing the structure of the frame of the conventional electronic equipment, and in that the electronic printed circuit boards, on which semiconductor devices each generating heat of a large heating value are mounted, can be concentratedly cooled.

By providing, among the heat generating printed circuit boards, the jetting duct having the jetting ports formed into arbitrary (desired) shapes and by constituting the convergent structure in which the cross sectional size is reduced downstream, the cooling air can be effectively utilized. Furthermore, the supply of the slope (inclined) flows to the heat generating members enables the pressure loss in the passage to be reduced.

By employing the structure in which the distance from the heat generating members to the jetting duct is shortened as the heating values of the heat generating members is increased or as the positions become more downstream from the air supply means, the temperature distribution among the heat generating members can be made uniform.

By providing, for the jetting duct, the nozzles for supplying cooling air to a plurality of the heat generating members disposed perpendicularly to the flow, the working cost for opening the jetting ports can be reduced. Furthermore, since the jetting ports are opened to have the large areas, clogging of the jetting ports due to dust or the like can be prevented.

By provision of the guide plate, the flow rectifying metal net and or the curved branching portion(s), the pressure loss can be reduced and the airflow quantity can be equally distributed to each printed circuit board. Furthermore, the power required to rotate the fan can be reduced.

What is claimed is:

1. A jet cooling apparatus for cooling electronic equipment, in combination with an electronic equipment to be cooled, said electronic equipment including a plurality of electronic printed circuit boards mounted on a part of the electronic equipment, semiconductor devices, which are heat generating members, being mounted on the printed circuit boards and the printed circuit boards being stacked at predetermined intervals with respect to one another in a stacking direction, said cooling apparatus serving to cool the semiconductor devices by supplying cooling airflows to said electronic printed circuit boards, and said jet cooling apparatus comprising:

a body located at least substantially entirely to the side of said stacked electronic printed circuit boards as seen in a cross sectional view of said body and said stacked electronic printed circuit boards taken in said stacking direction, and said body having walls defining a substantially flat three dimensional space therein, the walls being spaced from edges of the stacked electronic printed circuit boards;

an air supply fan, mounted to one of the walls of said body on a side thereof opposite another wall of said body facing said edges of the stacked electronic printed circuit boards as seen in said cross sectional view; and a plurality of jet cooling means positioned in parallel to each other at said another wall of said body facing said circuit boards, for allowing, the air having passed through the space from the air supply fan to be flown out therethrough to be supplied to the semiconductor devices, each of said jet cooling means having at least one elongated aperture.

2. The combination according to claim 1, wherein the plurality of jet cooling means comprises slits each of which is formed into a rectangular shape.

3. The combination according to claim 1, wherein the plurality of jet cooling means comprises slits disposed in gaps between a plurality of said stacked electronic printed circuit boards.

4. The combination according to claim 1, wherein the plurality of jet cooling means comprises rectangular slits each having a width corresponding to a width of an associated array of said semiconductor devices mounted on said electronic printed circuit boards, the array being situated at a level of the associated slit.

5. The combination according to claim 1, wherein said apparatus body comprises a chamber, and the plurality of jet cooling means comprises slits, and ribs running parallel to said slits formed on an inner face of the wall of said chamber in which said slits are formed.

6. The combination according to claim 5, wherein said ribs are extended from said inner face of said wall of said chamber to have a length corresponding to an overall width of said chamber.

7. The combination according to claim 1, wherein said jet cooling means comprises nozzles projecting toward said printed circuit boards, the nozzles being disposed so that openings thereof face said heat generating members.

8. The combination according to claim 1, wherein said electronic equipment is a computer having a power source portion, a central processing unit, a memory and a input/output device accommodated in a frame thereof, said jet cooling apparatus for cooling electronic equipment being mounted on at least said central processing unit.

9. The combination according to claim 1, wherein said jet cooling apparatus further includes air flow distribution means for adjusting distribution of air flow through the elongated apertures of said jet cooling means.

10. A computer comprising:

a frame accommodating therein a plurality of electronic printed circuit boards mounted on a part thereof in stacked relation and on each of which semiconductor devices, which are heating generating members, are mounted, said stacked printed circuit boards being stacked at predetermined intervals with respect to one another in a stacking direction; and a jet cooling apparatus having a body disposed at least substantially entirely at a position adjacent to the side of said stacked electronic printed circuit boards as seen in a cross sectional view of the stacked printed circuit boards taken in said stacked direction, said body having walls defining a substantially flat three dimensional space therein, the walls being spaced from edges of the stacked electronic printed circuit boards as seen in said cross sectional view, and wherein air supply means is mounted to at least on of said walls, and a plurality of jet cooling means positioned in parallel to each other are provided at an other one of the walls of said body opposing said air supply means for allowing the air having passed through the space from the air supply means to be flown out therethrough to be supplied to said semiconductor devices, each of said jet cooling means having at least one elongated aperture and having a length substantially covering a width of a semiconductor-devices-mounting region of at least one associated one of the plurality of printed circuit boards.

11. A computer according to claim 10, wherein same of said semiconductor devices which are mounted on said printed circuit boards and which are heat generating members each have a cooling fin.

* * * * *